(12) United States Patent
Taguchi

(10) Patent No.: US 11,765,879 B2
(45) Date of Patent: Sep. 19, 2023

(54) SUBSTRATE PROCESSING APPARATUS AND MONITORING METHOD

(71) Applicant: Tokyo Electron Limited, Tokyo (JP)

(72) Inventor: Junnosuke Taguchi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 9 days.

(21) Appl. No.: 16/868,843

(22) Filed: May 7, 2020

(65) Prior Publication Data

US 2020/0365594 A1 Nov. 19, 2020

(30) Foreign Application Priority Data

May 15, 2019 (JP) ................................ 2019-092353

(51) Int. Cl.
| | |
|---|---|
| H01L 21/67 | (2006.01) |
| H10B 12/00 | (2023.01) |
| H01L 27/02 | (2006.01) |
| H01L 21/68 | (2006.01) |
| H10B 20/00 | (2023.01) |

(52) U.S. Cl.
CPC ....... *H10B 12/01* (2023.02); *H01L 21/67265* (2013.01); *H01L 21/681* (2013.01); *H01L 27/0288* (2013.01); *H10B 20/00* (2023.02)

(58) Field of Classification Search
CPC ......... H01L 27/10844; H01L 21/67265; H01L 21/681; H01L 27/0288; H01L 27/112; H01L 21/67288; H01L 21/68764; H01L 21/68771; H01L 21/67011; C23C 16/45565; C23C 16/4584; C23C 16/52; C23C 16/45551; G01B 11/16
See application file for complete search history.

(56) References Cited

U.S. PATENT DOCUMENTS

| | | | |
|---|---|---|---|
| 10,615,066 B2* | 4/2020 | Chiba | H01L 21/67288 |
| 2006/0124615 A1* | 6/2006 | Azuma | B23K 26/40 |
| | | | 219/121.67 |
| 2009/0155452 A1* | 6/2009 | Kim | C23C 16/52 |
| | | | 427/8 |
| 2009/0218314 A1* | 9/2009 | Davis | H01J 37/32935 |
| | | | 385/115 |
| 2010/0055351 A1* | 3/2010 | Kato | C23C 16/45563 |
| | | | 118/712 |

(Continued)

FOREIGN PATENT DOCUMENTS

| | | |
|---|---|---|
| JP | 2012-187554 | 10/2012 |
| JP | 2013-251479 | 12/2013 |

(Continued)

*Primary Examiner* — Bitew A Dinke
(74) *Attorney, Agent, or Firm* — IPUSA, PLLC

(57) ABSTRACT

A substrate processing apparatus according to an aspect of the present disclosure includes a mounting section on which a substrate is placed, a structure member provided above the mounting section so as to face the mounting section, and an optical sensor. The optical sensor is configured to detect a height of the mounting section, a height of the structure member, and a height of the substrate, by emitting light from above the structure member to a predetermined location of the mounting section, a predetermined location of the structure member, and the substrate, and by receiving reflection light from the mounting section, the structure member, and the substrate.

14 Claims, 15 Drawing Sheets

(56) References Cited

U.S. PATENT DOCUMENTS

| | | | | |
|---|---|---|---|---|
| 2010/0124610 A1* | 5/2010 | Aikawa | ............... | C23C 16/4584 |
| | | | | 427/255.28 |
| 2010/0227046 A1* | 9/2010 | Kato | ................. | H01L 21/67196 |
| | | | | 118/712 |
| 2010/0229797 A1* | 9/2010 | Kato | .................... | C23C 16/402 |
| | | | | 118/730 |
| 2011/0139074 A1* | 6/2011 | Kato | ................. | C23C 16/45578 |
| | | | | 118/730 |
| 2013/0010289 A1* | 1/2013 | Nakamizo | ......... | H01L 21/67259 |
| | | | | 356/237.2 |
| 2013/0068727 A1* | 3/2013 | Okita | ..................... | B44C 1/227 |
| | | | | 216/59 |
| 2014/0004713 A1* | 1/2014 | Igeta | .................... | C23C 16/303 |
| | | | | 438/775 |
| 2014/0020834 A1* | 1/2014 | Zhou | ................. | H01L 21/67253 |
| | | | | 156/345.34 |
| 2014/0174351 A1* | 6/2014 | Aikawa | ............ | C23C 16/45551 |
| | | | | 118/713 |
| 2014/0345523 A1* | 11/2014 | Kikuchi | ............ | C23C 16/45551 |
| | | | | 118/712 |
| 2016/0293390 A1* | 10/2016 | Miura | .................... | H01J 37/321 |
| 2019/0013224 A1* | 1/2019 | Chiba | ................ | H01L 21/67288 |
| 2020/0083063 A1* | 3/2020 | Shin | ................... | H01L 21/02098 |

FOREIGN PATENT DOCUMENTS

| | | |
|---|---|---|
| JP | 2016-156066 | 9/2016 |
| JP | 2019-016662 | 1/2019 |

\* cited by examiner

SUBSTRATE PROCESSING APPARATUS AND MONITORING METHOD

CROSS-REFERENCE TO RELATED APPLICATIONS

This patent application is based upon and claims priority to Japanese Patent Application No. 2019-092353 filed on May 15, 2019, the entire contents of which are incorporated herein by reference.

TECHNICAL FIELD

The present disclosure relates to a substrate processing apparatus and a monitoring method.

BACKGROUND

There is known a substrate warping monitoring device for monitoring bending of a substrate placed on a substrate mounting region along a circumferential direction of a rotary table, during rotation of the rotary table (see Patent Document 1, for example).

CITATION LIST

Patent Document

[Patent Document 1] Japanese Laid-open Patent Application Publication No. 2019-016662

SUMMARY

The present disclosure provides a technique capable of stable operation of the apparatus.

A substrate processing apparatus according to an aspect of the present disclosure includes a mounting section on which a substrate is placed, a structure member provided above the mounting section so as to face the mounting section, and an optical sensor. The optical sensor is configured to detect a height of the mounting section, a height of the structure member, and a height of the substrate, by emitting light from above the structure member to a predetermined location of the mounting section, a predetermined location of the structure member, and the substrate, and by receiving reflection light from the mounting section, the structure member, and the substrate.

DETAILED DESCRIPTION OF EMBODIMENTS

Figure 1:
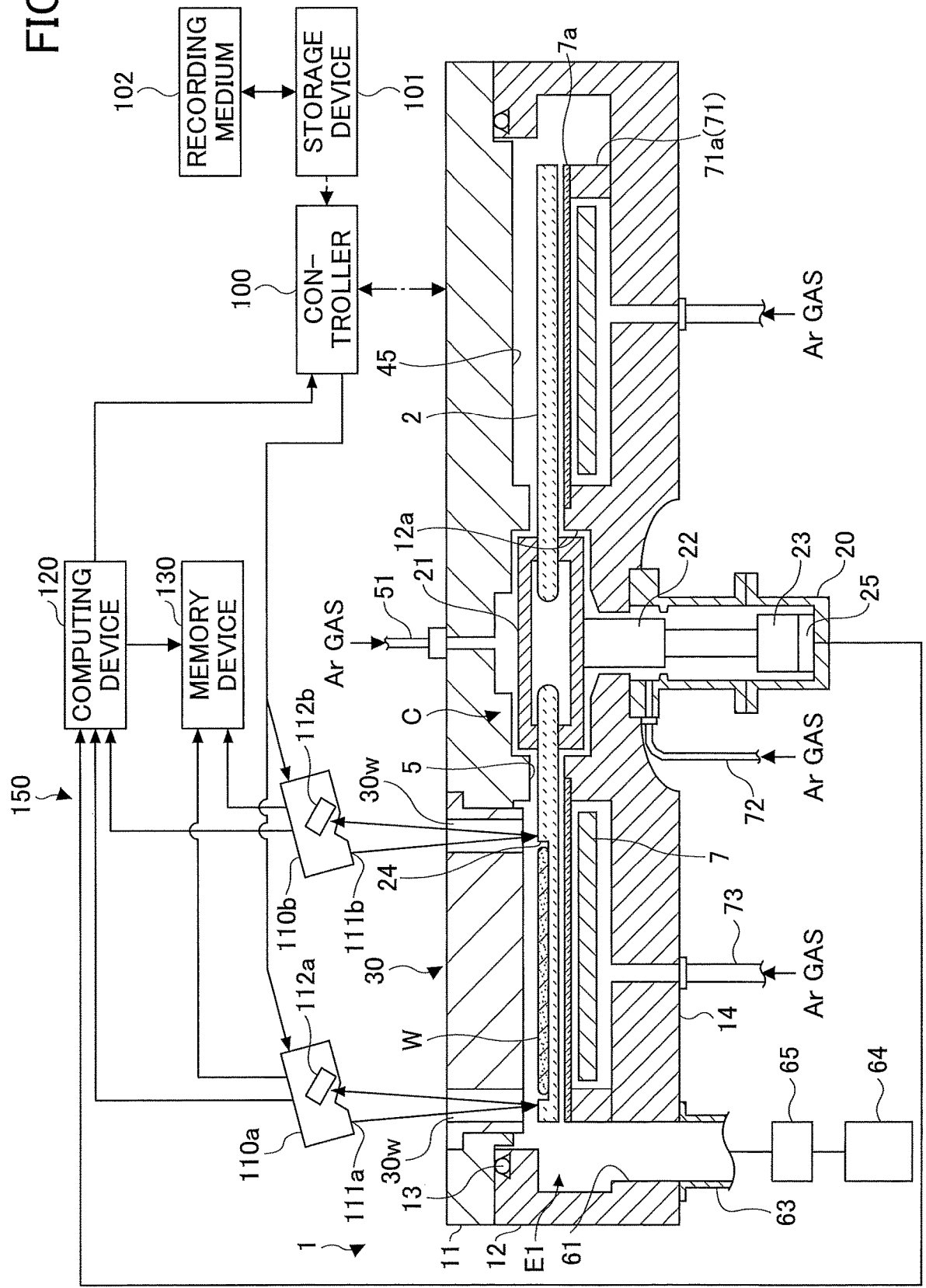
FIG. 1 is a cross-sectional view illustrating an example of a configuration of a deposition apparatus according to an embodiment.

Hereinafter, a non-limiting embodiment of the present disclosure will be described with reference to the accompanying drawings. In all the accompanying drawings, the same or corresponding reference numerals shall be attached to the same or corresponding components and the description thereof may be omitted.

<Substrate Processing Apparatus>

A substrate processing apparatus according to the present embodiment will be described. The techniques described in the present embodiment can be applied to various substrate processing apparatuses as long as they apply treatment to substrates while rotating a rotary table. However, in the following description, an example in which a substrate processing apparatus is configured as a deposition apparatus will be described mainly.

Figure 2:
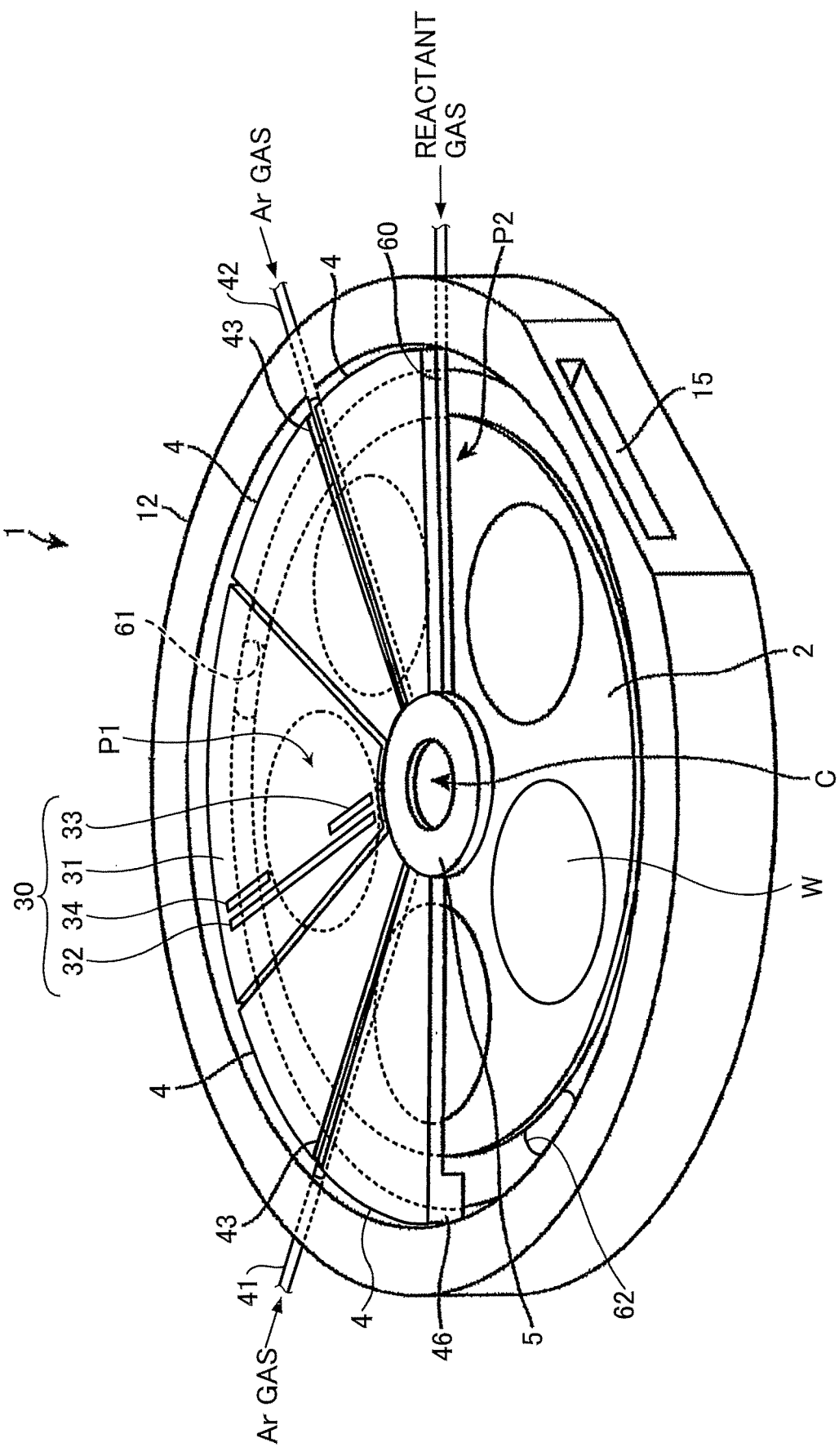
FIG. 2 is a perspective view illustrating a configuration in a vacuum vessel of the deposition apparatus of FIG. 1.
Figure 3:
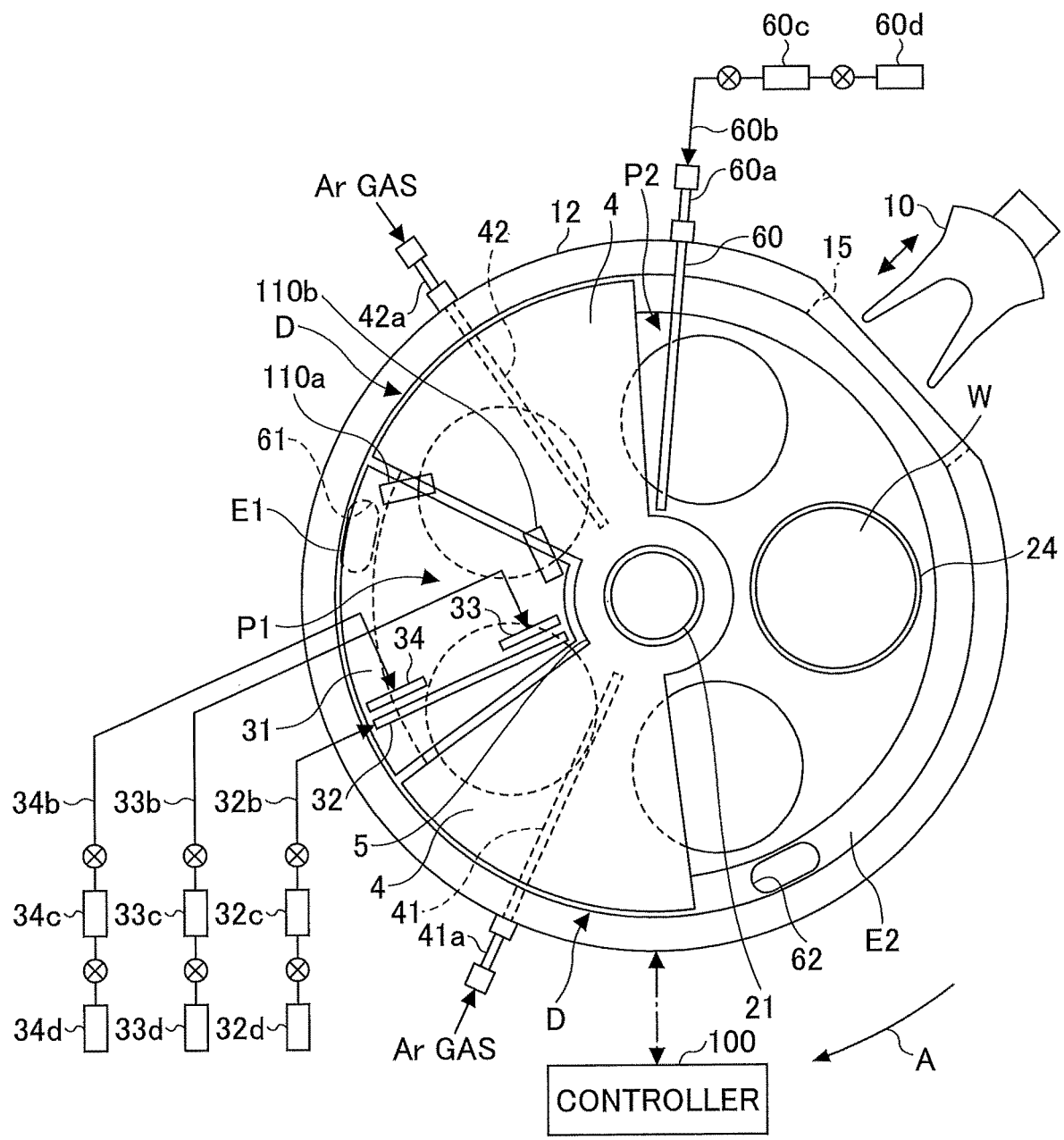
FIG. 3 is a view illustrating a configuration in a vacuum vessel of the deposition apparatus of FIG. 1.

FIG. 1 is a cross-sectional view illustrating an example of a configuration of the deposition apparatus according to the present embodiment; FIGS. 2 and 3 are a perspective view and a plan view illustrating the configuration in a vacuum vessel 1 of the deposition apparatus of FIG. 1, respectively. Note that, in FIGS. 2 and 3, illustration of a top plate 11 is omitted.

Referring to FIGS. 1 through 3, a deposition apparatus includes a flat vacuum vessel 1 having a substantially circular planar shape, and a rotary table 2 disposed inside the vacuum vessel 1. The rotary table 2 has a rotational center at the center of the vacuum vessel 1, in a plan view. The vacuum vessel 1 is a processing chamber in which a substrate to be processed, such as a semiconductor wafer (hereinafter, referred to as a "wafer W"), is loaded and a deposition process is applied to the wafer W.

The vacuum vessel 1 includes a container body 12 having a cylindrical shape with a bottom, and a removable top plate 11. The top plate 11 is disposed on the upper surface of the container body 12 in an airtight manner via a sealing member 13 such as an O-ring (FIG. 1).

A part of the top plate 11 is provided with a showerhead 30. Windows 30w are formed in the showerhead 30. The windows 30w are provided with quartz glass, for example, and the vacuum vessel 1 is configured such that an interior of the vacuum vessel 1 is visible from outside of the vacuum vessel 1.

The rotary table 2 is a mounting section on which the wafer W is placed. On a surface of the rotary table 2, circular recesses 24 are formed, and each of the recesses 24 supports a wafer W placed on it. A motor 23 is connected to the rotary table 2 via a core 21 and a rotating shaft 22, and the rotary table 2 is rotated by driving force of the motor 23.

The motor 23 is provided with an encoder 25. The encoder 25 detects a rotation angle of the rotating shaft 22. In the present embodiment, in order to monitor bending states of wafers W that are respectively placed on the recesses 24 on the rotary table 2, the encoder 25 is used as a means for specifying a correspondence between the recesses 24 and the wafers W and specifying a location of the wafers W.

Laser displacement meters 110a and 110b are provided above the respective windows 30w of the showerhead 30. The laser displacement meters 110a and 110b are provided on an outer peripheral side and an inner peripheral side of the rotary table 2, respectively. The laser displacement meters 110a and 110b may be, for example, two-dimensional laser displacement meters. The laser displacement meters 110a and 110b include the light emitting sections 111a and 111b and the light receiving sections 112a and 112b, respectively.

Each of the laser displacement meters 110a and 110b is configured to measure a height position (position in a vertical direction) of the upper surface of the rotary table 2 and a position in the vertical direction of a periphery of a bottom plate 31 of the showerhead 30 simultaneously. Note that, in the present disclosure, the height position means a distance from a predetermined location. The predetermined location may be a horizontal plane, such as a surface of the rotary table 2, and may also be referred to as a "reference surface". In the following description, the height position may also be referred to as a "height". The laser displacement meters 110a and 110b emit respective laser beams, from light emitting sections 111a and 111b to the upper surface of the rotary table 2 and the periphery of the bottom plate 31 of the showerhead 30, and light receiving sections 112a and 112b receive reflected laser light (for example, diffused reflection light). Thus, the distances between the laser displacement meters 110a and 110b and the upper surface of the rotary table 2 and between the laser displacement meters 110a and 110b and the periphery of the bottom plate 31 of the showerhead 30 can be detected, and the distance between the upper surface of the rotary table 2 and the bottom plate 31 can be detected. In addition, by utilizing a time series of the distance between the upper surface of the rotary table 2 and the bottom plate 31, it is possible to detect the change in the distance.

The laser displacement meters 110a and 110b are also configured to measure a height position of the upper surface of the wafer W placed on the recess 24 of the rotary table 2. The laser displacement meters 110a and 110b emit respective laser beams from the light emitting sections 111a and 111b to the upper surface of the wafer W, and the light receiving sections 112a and 112b receive reflected laser light (for example, regular reflection light). This allows a distance between the laser displacement meters 110a and 110b and the upper surface of the wafer W to be detected. Thus, when the wafer W moves along the rotational direction of the rotary table 2 by rotation of the rotary table 2, a surface profile of the wafer W at positions to which the laser beam is emitted can be measured. That is, because the distance between the laser displacement meter 110a or 110b and the wafer W varies depending on roughness on the surface of the wafer W, change in the roughness on the surface of the wafer W is measured. That is, the surface profile can be measured. For example, in a case in which the deposition apparatus is configured such that laser light emitted from the laser displacement meter 110a or 110b irradiates the center of the wafer W, the surface profile on a line passing through the center of the wafer W can be measured.

A computing device 120 calculates a height position of a lower surface of the showerhead 30 based on the height position of the bottom plate 31 measured by the laser displacement meters 110a and 110b, and a distance between the bottom plate 31 and the lower surface of the showerhead 30, which is stored in a memory device 130 in advance. The computing device 120 also calculates a distance between the upper surface of the rotary table 2 and the lower surface of the showerhead 30, based on the height position of the upper surface of the rotary table 2, which is measured by the laser displacement meters 110a and 110b, and based on the height position of the lower surface of the showerhead 30. Hereinafter, the distance between the upper surface of the rotary table 2 and the lower surface of the showerhead 30 may also be referred to as a "gap". Further, when the height position of the rotary table 2 and the height position of the bottom plate 31 are measured, the computing device 120 specifies a location on the surface of the rotary table 2 to which the distance from the bottom plate 31 is to be calculated, by receiving a signal from the encoder 25.

The computing device 120 also calculates a bending amount of the wafer W on the recess 24, based on information of the surface profile of the wafer W measured by the laser displacement meters 110a and 110b. Note that the computing device 120 calculates the bending amount of the wafer W not only by using the surface profile of the wafer W but also by using a measured value from a predetermined reference surface measured by the laser displacement meters 110a and 110b as the reference value. Details of this method for calculating the bending amount will be described below. Also, when it is detected that a bending amount of a wafer W has exceeded a predetermined threshold, the computing device 120 specifies the wafer W whose bending amount has exceeded the predetermined threshold, from among wafers on the recesses 24, by receiving a signal from the encoder 25. When it is determined that a bending amount of a wafer W has exceeded the predetermined threshold, the computing device 120 outputs an alarm signal to the controller 100.

An appropriate calculation processing means may be selected as the computing device 120, depending on its application. For example, the computing device 120 may include a CPU (Central Processing Unit) and a memory. The computing device 120 may be configured by an arithmetic processing device such as a microcomputer that performs an operation in accordance with a computer program, or an ASIC (Application Specific Integrated Circuit), which is an integrated circuit designed and manufactured for a specific application.

The memory device 130 stores a distance between the bottom plate 31 and the lower surface of the showerhead 30, a distance between the upper surface of the rotary table 2 and the bottom plate 31 measured by the laser displacement meters 110a and 110b, the measurement value of the reference surface, and the like. In the example of FIG. 1, the memory device 130 is illustrated as a component separate from the computing device 120, but the memory device 130 may be incorporated in the computing device 120. That is, a memory inside the computing device 120 may be used as the memory device 130.

In the present embodiment, by constantly monitoring bending of a wafer W during wafer processing, detachment of the wafer W can be avoided by reducing rotating speed of the rotary table 2 or by stopping rotation of the rotary table 2 when a bending amount of the wafer W exceeds the predetermined threshold. In addition, by constantly monitoring bending of a wafer W, a state in which the wafer W is detached from the recess 24 can be detected. Specifically, if measurement of a surface profile of a wafer W is performed by the laser displacement meters 110a and 110b when a wafer W is not present in the recess 24, laser light is irradiated onto the bottom of the recess 24 of the rotary table 2. In such a case, information obtained from the laser displacement meters 110a and 110b is obviously different from information obtained in a case in which laser light is irradiated on the wafer W. Thus, a state in which the wafer W is detached from the recess 24 can be detected.

Note that the laser displacement meters 110a and 110b, the computing device 120, the memory device 130, and the encoder 25 configure a monitoring device 150 according to the present embodiment.

The controller 100 is configured by a computer for example, and controls an entirety of the deposition apparatus. When an alarm signal is received from the computing device 120, the controller 100 reduces or stops rotation of the rotary table 2. Accordingly, when a bending amount of the wafer W on the recess 24 increases and there is a possibility of detachment of the wafer W, the rotation of the rotary table 2 can be reduced or stopped immediately, and it is possible to prevent the wafer W from damaging the interior of the vacuum vessel 1 or damaging other wafers W in advance.

When detachment of the wafer W from the recess 24 is detected, the controller 100 performs control for stopping the rotary table 2. This is because immediate stop of rotation of the rotary table 2 is required in a case in which detachment has occurred, in order to prevent the interior of the vacuum vessel 1 from being damaged as quickly as possible.

A program is stored in a memory of the controller 100 to cause the deposition apparatus to execute a predetermined deposition method including slowing down or stopping rotation of the rotary table 2 based on an alarm signal from the monitoring device 150, under control of the controller 100. The program includes steps of causing the deposition apparatus to execute the predetermined deposition method including slowing down or stopping rotation of the rotary table 2. The program may be stored in a recording medium 102, such as a hard disk drive, a compact disc, a magneto-optical disc, a memory card, or a flexible disk. The program is installed into the controller 100, by loading the program stored in the recording medium 102 into a storage device 101 using a predetermined reading device.

Next, a structure of the deposition apparatus will be described in more detail with reference to FIGS. 2 to 5.

As illustrated in FIGS. 2 and 3, on the upper surface of the rotary table 2, multiple circular recesses 24 (five recesses in the illustrated example) are provided along the rotational direction (circumferential direction) of the rotary table 2. A wafer W can be placed in each of the recesses 24. In FIG. 3, for convenience, a case in which a wafer W is placed in only one of the recesses 24 is illustrated. The recess 24 has an inner diameter that is slightly greater (greater by 4 mm, for example) than a diameter of a wafer W, and a depth approximately equal to a thickness of a wafer W. Therefore, when a wafer W is placed in the recess 24, the surface of the wafer W and the surface of the rotary table 2 (an area on which the wafer W is not placed) become the same height. At the bottom surface of the recess 24, through-holes (not illustrated) are formed, through which, for example, three lift pins penetrate to support the back surface of a wafer W and to raise and lower the wafer W.

Above the rotary table 2, the bottom plate 31 of the showerhead 30, a processing gas nozzle 60, and separation gas nozzles 41 and 42 are arranged at intervals, in a circumferential direction of the vacuum vessel 1, that is, in a rotational direction of the rotary table 2 (see the arrow A of FIG. 3). In the example illustrated in FIG. 3, the separation gas nozzle 41, the bottom plate 31, the separation gas nozzle 42, and the processing gas nozzle 60 are arranged in this order clockwise (rotational direction of the rotary table 2), from a conveying port 15 to be described below.

In the bottom plate 31 of the showerhead 30, a raw material gas supply section 32, an axial-side auxiliary gas supply section 33, and an outer-side auxiliary gas supply section 34 are formed. The raw material gas supply section 32, the axial-side auxiliary gas supply section 33, and the outer-side auxiliary gas supply section 34 supply a raw material gas, an axial-side auxiliary gas, and an outer-side auxiliary gas, respectively. Hereinafter, the axial-side auxiliary gas and the outer-side auxiliary gas are collectively referred to as an auxiliary gas.

Multiple gas discharge holes (not illustrated) are formed on the bottom surface of each of the raw material gas supply section 32, the axial-side auxiliary gas supply section 33, and the outer-side auxiliary gas supply section 34, to supply the raw material gas and the auxiliary gas along the radial direction of the rotary table 2.

The raw material gas supply section 32 extends radially throughout the radius of the rotary table 2 to cover the entire wafer W. The axial-side auxiliary gas supply section 33 extends only in a predetermined area along the radial direction of the rotary table 2, which is approximately one-third of the raw material gas supply section 32, and is on the axial side of the rotary table 2. The outer-side auxiliary gas supply section 34 extends only in a predetermined area along the radial direction of the rotary table 2, which is approximately one-third of the raw material gas supply section 32, and is on the outer peripheral side of the rotary table 2.

As will be described in detail below, a distance between the axial-side auxiliary gas supply section 33 and the rotary table 2, and a distance between the outer-side auxiliary gas supply section 34 and the rotary table 2 are greater than a distance between the raw material gas supply section 32 and the rotary table 2, in order that the axial-side auxiliary gas supply section 33 and the outer-side auxiliary gas supply section 34 can supply the auxiliary gas for adjusting film thickness to increase in-plane uniformity, without interfering with flow of the raw material gas supplied from the raw material gas supply section 32. Details will be described below.

The raw material gas supply section 32, the axial-side auxiliary gas supply section 33, and the outer-side auxiliary gas supply section 34 are provided at the bottom plate 31 of the showerhead 30. Therefore, the raw material gas and auxiliary gas introduced into the showerhead 30 are introduced into the vacuum vessel 1 via the raw material gas supply section 32, the axial-side auxiliary gas supply section 33, and the outer-side auxiliary gas supply section 34.

The raw material gas supply section 32 is connected to a raw material gas supply source 32d through a pipe 32b, a flow controller 32c, and the like. The axial-side auxiliary gas supply section 33 is connected to an axial-side auxiliary gas supply source 33d through a pipe 33b, a flow controller 33c, and the like. Further, the outer-side auxiliary gas supply section 34 is connected to an outer-side auxiliary gas supply source 34d through a pipe 34b, a flow controller 34c, and the like. The raw material gas may be a silicon-containing gas, such as an organic aminosilane gas, or a titanium-containing gas such as $TiCl_4$. Examples of the axial-side auxiliary gas and the outer-side auxiliary gas may include a noble gas such as Ar, an inert gas such as nitrogen gas, the same gas as the raw material gas, a mixture of these gases, and any other types of gas. Gas that is suitable for, for example, improving in-plane uniformity or adjusting film thickness, is selected as the auxiliary gas, depending on its application and process.

In the example illustrated in the drawings, the sources 32d, 33d, and 34d are respectively connected to the raw material gas supply section 32, the axial-side auxiliary gas supply section 33, and the outer-side auxiliary gas supply section 34, in a one-to-one configuration, but not limited thereto. For example, in a case in which a mixed gas is to be supplied, pipes may be further added to connect gas supply lines with each other, in order to supply a gas of an appropriate mixture ratio to the raw material gas supply section 32, the axial-side auxiliary gas supply section 33, and the outer-side auxiliary gas supply section 34 individually. In a case of supplying a mixed gas, to both the raw material gas supply section 32 and the axial-side auxiliary gas supply section 33, a raw material gas and an auxiliary gas may be supplied from the raw material gas supply source 32d and the axial-side auxiliary gas supply source 33d respectively, and the raw material gas and the auxiliary gas may be mixed through the pipes connecting between a gas supply line of the raw material gas supply source 32d and a gas supply line of the axial-side auxiliary gas supply source 33d, to supply a mixed gas of the raw material gas and the auxiliary gas to the raw material gas supply section 32 and the axial-side auxiliary gas supply section 33. That is, as long as a gas can be ultimately supplied to each of the raw material gas supply section 32, the axial-side auxiliary gas supply section 33, and the outer-side auxiliary gas supply section 34 individually, a connection structure of the intermediate gas supply passage does not matter.

Each of the processing gas nozzles 60 and the separation gas nozzles 41 and 42 may be formed of, for example, quartz. The processing gas nozzle 60 is introduced into the vacuum vessel 1 from the outer peripheral wall of the vacuum vessel 1 along the radial direction of the container body 12, and is mounted horizontally to the rotary table 2 by fixing a gas inlet port 60a, which is an end of the processing gas nozzle 60, to the outer peripheral wall of the container body 12. The separation gas nozzles 41 and 42 are introduced into the vacuum vessel 1 from the outer peripheral wall of the vacuum vessel 1 along the radial direction of the container body 12, and are mounted horizontally to the rotary table 2 by fixing gas inlet ports 41a and 42a, which are ends of the separation gas nozzles 41 and 42 respectively, to the outer peripheral wall of the container body 12.

The processing gas nozzle 60 is connected to a reactant gas supply source 60d, via a pipe 60b, a flow controller 60c, and the like. A gas that reacts with a raw material gas to produce a reaction product is referred to as a reactant gas. For example, an oxidant gas such as $O_3$ is a reactant gas with respect to a silicon-containing gas, and a nitriding gas such as $NH_3$ is a reactant gas with respect to a titanium-containing gas. In the processing gas nozzle 60, multiple gas discharge holes 60h (FIG. 4) opening toward the rotary table 2 are arranged along a longitudinal direction of the processing gas nozzle 60, at intervals of 10 mm, for example.

Each of the separation gas nozzles 41 and 42 is connected to a source (not illustrated) of a separation gas via a pipe, a flow control valve (neither of which are illustrated), and the like. As the separation gas, a noble gas such as helium (He) or argon (Ar), or an inert gas such as nitrogen ($N_2$) gas may be used. In the present embodiment, an Ar gas is used as an example.

A region below the bottom plate 31 of the showerhead 30 is referred to as a first processing region P1, in which the wafer W is caused to adsorb a raw material gas. A region below the processing gas nozzle 60 is referred to as a second processing region P2, in which a reactant gas that reacts with the raw material gas adsorbed on the wafer W is supplied, and in which a molecular layer of a reaction product is produced. The molecular layer of the reaction product constitutes a film to be deposited.

Referring again to FIGS. 2 and 3, two projections 4 are provided in the vacuum vessel 1. The projections 4 are attached to the back surface of the top plate 11 so as to protrude toward the rotary table 2, in order to form a separation region D with the separation gas nozzles 41 and 42. Each of the projections 4 has a fan-shaped plane, an apex of which is cut in a shape of an arc. In the present embodiment, an inner arc-shaped portion of the projection 4 is connected to the protruding portion (described below) and an outer arc of the projection 4 is disposed along the inner peripheral surface of the container body 12 of the vacuum vessel 1.

Figure 4:
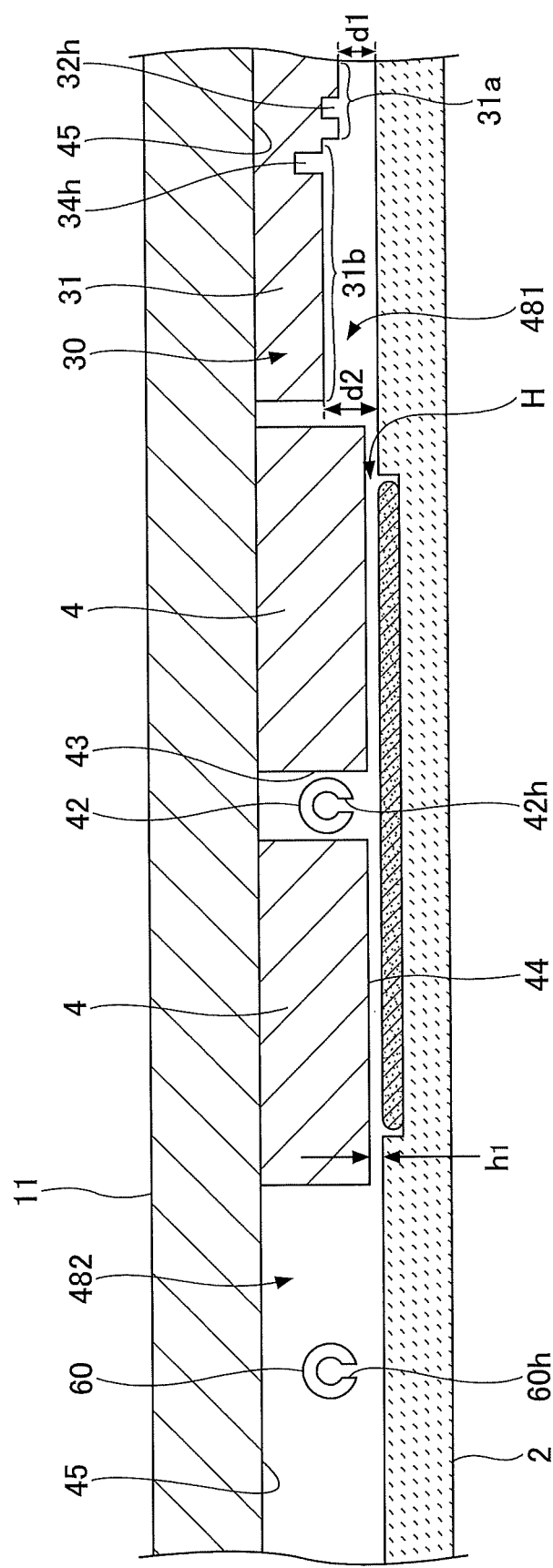
FIG. 4 is a cross-sectional view of the vacuum vessel along a concentric circle of a rotary table rotatably provided in the vacuum vessel of the deposition apparatus of FIG. 1.

FIG. 4 illustrates a cross-section of the vacuum vessel 1 along a concentric circle of the rotary table 2 from the bottom plate 31 of the showerhead 30 to the processing gas nozzle 60. As illustrated, the projections 4 are attached to the back surface of the top plate 11. Therefore, within the vacuum vessel 1, first ceiling surfaces 44 having flat and low ceiling surfaces, and second ceiling surfaces 45 are present. The first ceiling surfaces 44 correspond to lower surfaces of the projections 4, and the second ceiling surfaces 45 are higher than the first ceiling surfaces 44. At both sides of the first ceiling surfaces 44 in a circumferential direction, the second ceiling surfaces 45 are provided. Each of the first ceiling surface 44 has a fan-shaped plane, an apex of which is cut in a shape of an arc. As illustrated in FIG. 4, at the center of one of the projections 4 in the circumferential direction, a groove 43 that extends radially is formed, and the groove 43 accommodates the separation gas nozzle 42. Although FIG. 4 illustrates only one of the projections 4, the groove 43 is formed in the other projection 4 similarly, and a separation gas nozzle 41 is housed in the groove 43 of the other projection 4. Further, the bottom plate 31 of the showerhead 30 and the processing gas nozzle 60 are provided in spaces (481 and 482) under the second ceiling surfaces 45. The processing gas nozzle 60 is provided at a position spaced apart from the second ceiling surface 45, so as to be positioned near the wafer W. As illustrated in FIG. 4, the bottom plate 31 is provided in the space 481 on the right side of the projection 4, and the processing gas nozzle 60 is provided in the space 482 on the left side of the projection 4.

Multiple gas discharge holes 42h (see FIG. 4) that open toward the rotary table 2 are arranged on the separation gas nozzle 42 accommodated in the groove 43 of the one of the projections 4, at intervals of, for example, 10 mm, in a longitudinal direction of the separation gas nozzle 42. Similarly, on the separation gas nozzle 41 accommodated in the groove 43 of the other one of the projections 4, multiple gas discharge holes 41h (not illustrated) that open toward the rotary table 2 are arranged in a longitudinal direction of the separation gas nozzle 41, for example, at intervals of 10 mm, in the separation gas nozzle 41.

The raw material gas supply section 32, the axial-side auxiliary gas supply section 33, and the outer-side auxiliary gas supply section 34 provided in the bottom plate 31 of the showerhead 30 have gas discharge holes 32h, 33h, and 34h, respectively (note that the gas discharge hole 33h is not illustrated in FIG. 4). As illustrated in FIG. 4, the gas discharge hole 32h of the raw material gas supply section 32 is provided such that the gas discharge hole 32h is positioned at the same height as the gas discharge holes 60h of the processing gas nozzle 60 and the gas discharge holes 42h of the separation gas nozzle 42. Meanwhile, the gas discharge hole 34h of the outer-side auxiliary gas supply section 34 is provided at a position higher than the gas discharge holes 60h of the processing gas nozzle 60 and the gas discharge holes 42h of the separation gas nozzle 42. That is, the bottom plate 31 has two areas each having different height. The first area is referred to as a lower bottom area 31a, and a second area is referred to as a higher bottom area 31b. The higher bottom area 31b is positioned higher than lower bottom area 31a. The gas discharge hole 32h is provided in the lower bottom area 31a, and the gas discharge hole 34h is provided in the higher bottom area 31b. Although not illustrated in FIG. 4, the axial-side auxiliary gas supply section 33 is provided in the higher bottom area 31b, similar to the outer-side auxiliary gas supply section 34. The axial-side auxiliary gas supply section 33 and the outer-side auxiliary gas supply section 34 are provided to adjust a flow of the raw material gas. Therefore, if the flow of the raw material gas supplied from the raw material gas supply section 32 is inhibited, a function of improving in-plane uniformity of the adsorption of the raw material gas cannot be performed. That is, because it is necessary to limit an effect of the axial-side auxiliary gas supply section 33 and the outer-side auxiliary gas supply section 34 to an extent that the flow of the raw material gas is not hindered, it is preferable that a distance to the surface of the wafer W, from the axial-side auxiliary gas supply section 33 and the outer-side auxiliary gas supply section 34, is farther than a distance from the raw material gas supply section 32 to the surface of the wafer W.

Accordingly, in the deposition apparatus according to the present embodiment, the distance d2 from the axial-side auxiliary gas supply section 33 and the outer-side auxiliary gas supply section 34 to the rotary table 2 is longer than the distance d1 between the raw material gas supply section 32 and the rotary table 2. The distance d2 from the axial-side auxiliary gas supply section 33 and the outer-side auxiliary gas supply section 34 to the rotary table 2 may be set to a variety of values that are wider than the distance d1 between the raw material gas supply section 32 and the rotary table 2. The distance d2 may be set, for example, in a range of 1.1 to 3 times the distance d1, preferably in a range of 1.5 to 2.5 times the distance d1, and more preferably, approximately 2 times the distance d1. With respect to an actual distance of d2, for example, in a case in which the distance d1 is set to 1.5 mm, the distance d2 may be set to 3 mm, which is twice the distance d1.

Further, the height of the axial-side auxiliary gas supply section 33 and the height of the outer-side auxiliary gas supply section 34 are not required to be the same, and may be different as long as they are at higher positions than the raw material gas supply section 32. For example, let d3 be the distance between the axial-side auxiliary gas supply section 33 and the rotary table 2. In such a case, d1, d2, and d3 may be configured to satisfy d1<d3<d2. That is, the distance between the outer-side auxiliary gas supply section 34 and the rotary table 2 may be set to be larger than the distance between the axial-side auxiliary gas supply section 33 and the rotary table 2.

The first ceiling surface 44 forms a narrow space between the rotary table 2 and the first ceiling surface 44. The narrow space formed by the first ceiling surface 44 may also be referred to as a "separation space H". When Ar gas is supplied from the gas discharge holes 42h of the separation gas nozzle 42, the Ar gas flows toward the spaces 481 and 482 through the separation space H. As the volume of the separation space H is smaller than the volumes of the spaces 481 and 482, pressure in the separation space H can be increased by the Ar gas as compared to pressures in the spaces 481 and 482. That is, between the spaces 481 and 482, the separation space H of high pressure is formed. The Ar gas flowing from the separation space H into the spaces 481, 482 also acts as a counterflow against the raw material gas from the first processing region P1 and the reactant gas from the second processing region P2. Therefore, the raw material gas from the first processing region P1 and the reactant gas from the second processing region P2 are separated by the separation space H. Therefore, mixing and reacting of the raw material gas and the reactant gas in the vacuum vessel 1 is suppressed.

A height h1 of the first ceiling surfaces 44 relative to the upper surface of the rotary table 2 is set to a height suitable for making the pressure in the separating space H higher than the pressures in the spaces 481 and 482, in consideration of a pressure in the vacuum vessel 1 during deposition, rotating speed of the rotary table 2 during deposition, a flow rate of the separation gas supplied during deposition, and the like.

Meanwhile, on the back surface of the top plate 11, a protruding portion 5 (FIGS. 2 and 3) that surrounds the outer circumference of the core 21 that fixes the rotary table 2 is provided. In the present embodiment, the protruding portion 5 is continuous with a portion of the projection 4 at a side of a rotational center of the rotary table 2, and the protruding portion 5 is formed such that a lower surface of the protruding portion 5 is level with the first ceiling surface 44.

Figure 5:
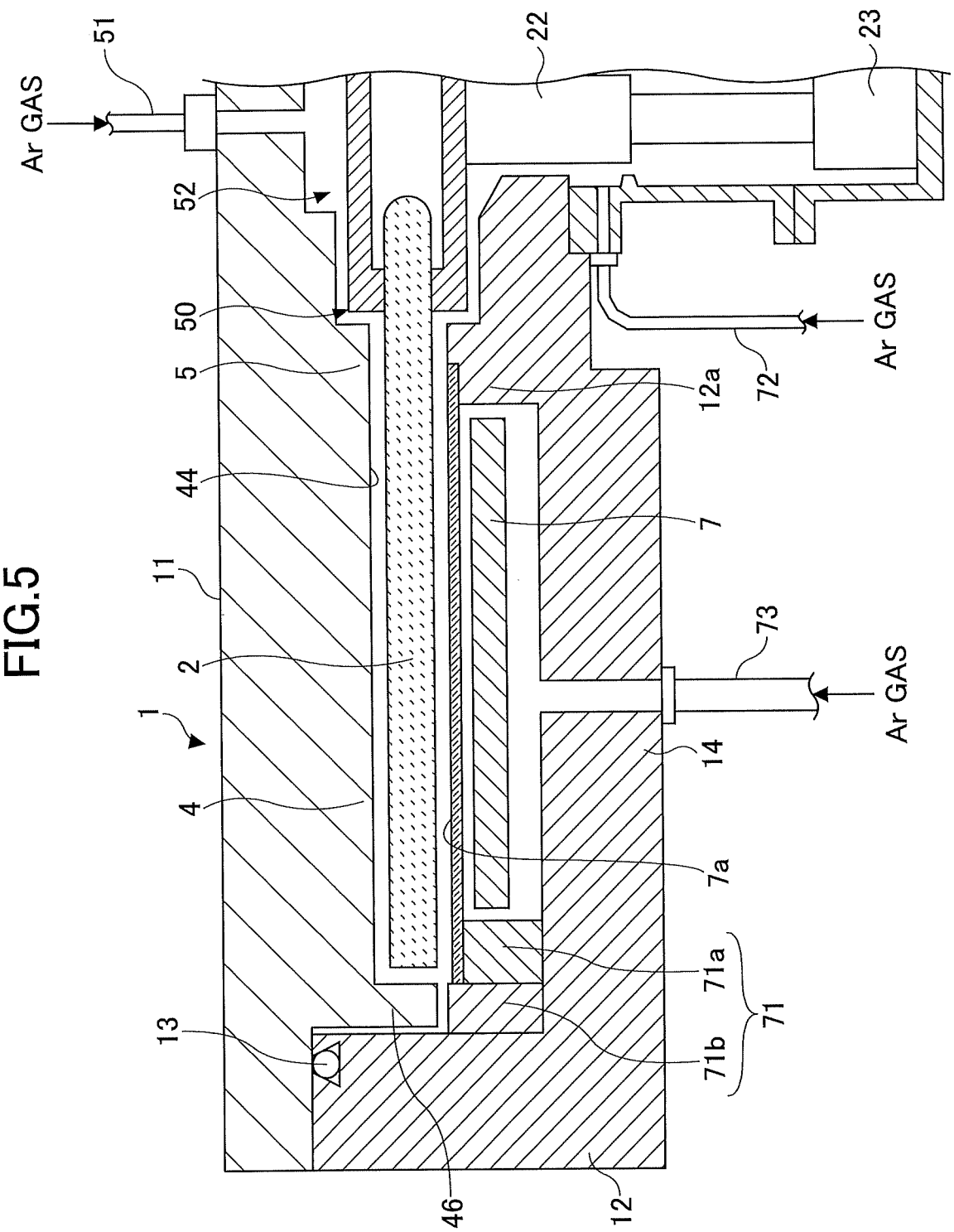
FIG. 5 is another cross-sectional view of the deposition apparatus of FIG. 1.

FIG. 5 is a cross-sectional view illustrating an area in which the first ceiling surface 44 is provided. As illustrated in FIG. 5, at a periphery (a portion facing the outer edge of the vacuum vessel 1) of the fan-shaped projection 4, an L-shaped bent portion 46 that faces an outer circumference of the rotary table 2 is formed. Similar to the projection 4, the bent portion 46 suppresses entry of the raw material gas and the reactant gas from both sides of the separation region D, thereby preventing the raw material gas being mixed with the reactant gas. As the fan-shaped projection 4 is provided on the top plate 11 and the top plate 11 can be removed from the container body 12, there is a slight gap between the outer peripheral surface of the bent portion 46 and the container body 12. A clearance between the inner peripheral surface of the bent portion 46 and the outer end surface of the rotary table 2 and the gap between the outer peripheral surface of the bent portion 46 and the container body 12 are set to a dimension similar to, for example, the height of the first ceiling surface 44 relative to the upper surface of the rotary table 2.

In the separation region D, the inner peripheral wall of the container body 12 is formed vertically in proximity to the outer peripheral surface of the bent portion 46 (FIG. 4). However, in a portion other than the separation region D, for example, the inner peripheral wall is depressed outwardly from a position facing the outer end surface of the rotary table 2 to the bottom 14 (FIG. 1). A cross-sectional shape of the depressed portion is generally rectangular. Hereinafter, for the sake of explanation, the depressed portion is referred to as an exhaust region. Specifically, an exhaust region communicating with the first processing region P1 is referred to as a first exhaust region E1, and an exhaust region communicating with the second processing region P2 is referred to as a second exhaust region E2. At the bottom of the first exhaust region E1 and the second exhaust region E2, a first exhaust port 61 and a second exhaust port 62 are formed, respectively, as illustrated in FIGS. 1-3. Each of the first exhaust port 61 and the second exhaust port 62 is connected to an exhaust device such as a vacuum pump 64, via an exhaust pipe 63. Also, a pressure controller 65 is provided in the exhaust pipe 63 between the first exhaust port 61 and the vacuum pump 64, and a pressure controller 65 is also provided in the exhaust pipe 63 between the second exhaust port 62 and the vacuum pump 64. Accordingly, each exhaust pressure in the first exhaust port 61 and the second exhaust port 62 can be controlled independently. The pressure controller 65 may be, for example, an automatic pressure controller (APC).

In a space between the rotary table 2 and the bottom 14 of the vacuum vessel 1, a heater unit 7 which is a heating means is provided, as illustrated in FIGS. 1 and 5. A wafer W on the rotary table 2 is heated to a temperature (e.g., 450° C.) determined by a process recipe, via the rotary table 2. An annular cover member 71 is provided below the periphery of the rotary table 2 (FIG. 5). The cover member 71 partitions an atmosphere from the upper space of the rotary table 2 to the first and second exhaust regions E1 and E2 and an atmosphere in which the heater unit 7 is disposed, to prevent gas from entering the lower area of the rotary table 2. The cover member 71 includes an inner member 71a and an outer member 71b. The inner member 71a is disposed below a periphery of the rotary table 2 such that an upper surface of the inner member 71a faces an outer circumference of the rotary table 2 or a space outside of the outer circumference of the rotary table 2. The outer member 71b is disposed between the inner member 71a and an inner wall surface of the vacuum vessel 1. The outer member 71b is provided below the bent portion 46 formed at the periphery of the projection 4 in the separation region D, and is in close proximity to the bent portion 46. The inner member 71a surrounds the heater unit 7 throughout below the outer circumference of the rotary table 2 (and below a slightly external side of the outer circumference of the rotary table 2).

In a vicinity of a center side of the lower surface of the rotary table 2, a portion of the bottom 14, which is positioned closer to the rotational center than the space in which the heater unit 7 is disposed, protrudes upward close to the core 21, to form a projection 12a. A space between the projection 12a and the core 21 is narrow, and a space between the rotating shaft 22 and an inner peripheral surface of a through-hole for the rotating shaft 22 passing through the bottom 14 is also narrow, which communicates with the casing 20. The casing 20 is provided with a purge gas supply line 72 for supplying Ar gas as a purge gas into a narrow space, in order to purge. Below the heater unit 7, multiple purge gas supply lines 73 are provided at the bottom 14 of the vacuum vessel 1 at predetermined angular intervals, to purge the space in which the heater unit 7 is disposed (one purge gas supply line 73 is illustrated in FIG. 5). A lid member 7a is provided between the heater unit 7 and the rotary table 2 so as to cover a region from an inner peripheral wall of the outer member 71b (the upper surface of the inner member 71a) to an upper end of the projection 12a in a circumferential direction, in order to prevent gas from entering the area in which the heater unit 7 is disposed. The lid member 7a may be made of, for example, quartz.

A separation gas supply line 51 is connected to the center of the top plate 11 of the vacuum vessel 1, and is configured to supply Ar gas, which is the separation gas, to a space 52 between the top plate 11 and the core 21. The separation gas supplied to the space 52 is discharged toward the periphery along the surface of the rotary table 2 on which a wafer is placed, through a narrow gap 50 between the protruding portion 5 and the rotary table 2. The gap 50 may be maintained at a pressure higher than spaces 481 and 482 by the separation gas. Accordingly, the gap 50 prevents a raw material gas supplied to the first processing region P1 and a reactant gas supplied to the second processing region P2 from being mixed through a central region C. That is, the gap 50 (or the central region C) functions similarly to the separation space H (or the separation region D).

As described above, a noble gas such as Ar or an inert gas such as $N_2$ (hereinafter collectively referred to as a "purge gas") is supplied from above and below, via the separation gas supply line 51 and the purge gas supply line 72, to an axial side of the rotary table 2. If a flow rate of the raw material gas is set to a small flow rate, for example, 30 sccm or less, the raw material gas is affected by the Ar gas on the axial side, and concentration of the raw material gas is reduced on the axial side of the rotary table 2, thereby reducing in-plane uniformity of film thickness. In the deposition apparatus according to the present embodiment, the axial-side auxiliary gas supply section 33 is provided on the axial side to supply an auxiliary gas, thereby reducing the effect of purge gas flowing out of the axial side without control, and appropriately controlling the concentration of the raw material gas. From this viewpoint, the axial-side auxiliary gas supply section 33 plays a more important role than the outer-side auxiliary gas supply section 34.

Therefore, in another embodiment, the bottom plate 31 of the showerhead 30 of the deposition apparatus may be configured to include only the raw material gas supply section 32 and the axial-side auxiliary gas supply section 33. Even in such a configuration, decrease in film thickness on the axial side of the rotary table 2 can be prevented, and a sufficient effect can be obtained. However, in order to adjust the film thickness more accurately for a variety of processes, it is preferable that not only the axial-side auxiliary gas supply section 33 but also the outer-side auxiliary gas supply section 34 is provided.

As illustrated in FIGS. 2 and 3, a conveying port 15 is formed on the side wall of the vacuum vessel 1 to pass a wafer (substrate) between an external conveying arm 10 and the rotary table 2. The conveying port 15 is opened and closed by a gate valve (not illustrated). When the recess 24, which is a wafer mounting area in the rotary table 2, is moved to a position facing the conveying port 15, a wafer is passed between the recess 24 and the conveying arm 10. Therefore, below the rotary table 2, lift pins that lift the wafer W from the back surface by passing through the recess 24, and a lifting mechanism for the lift pins, are provided at a location at which the wafer W is passed between the recess 24 and the conveying arm 10 corresponding to the feeding position. Note that the lift pins and the lifting mechanism are not illustrated in the drawings.

Figure 6:
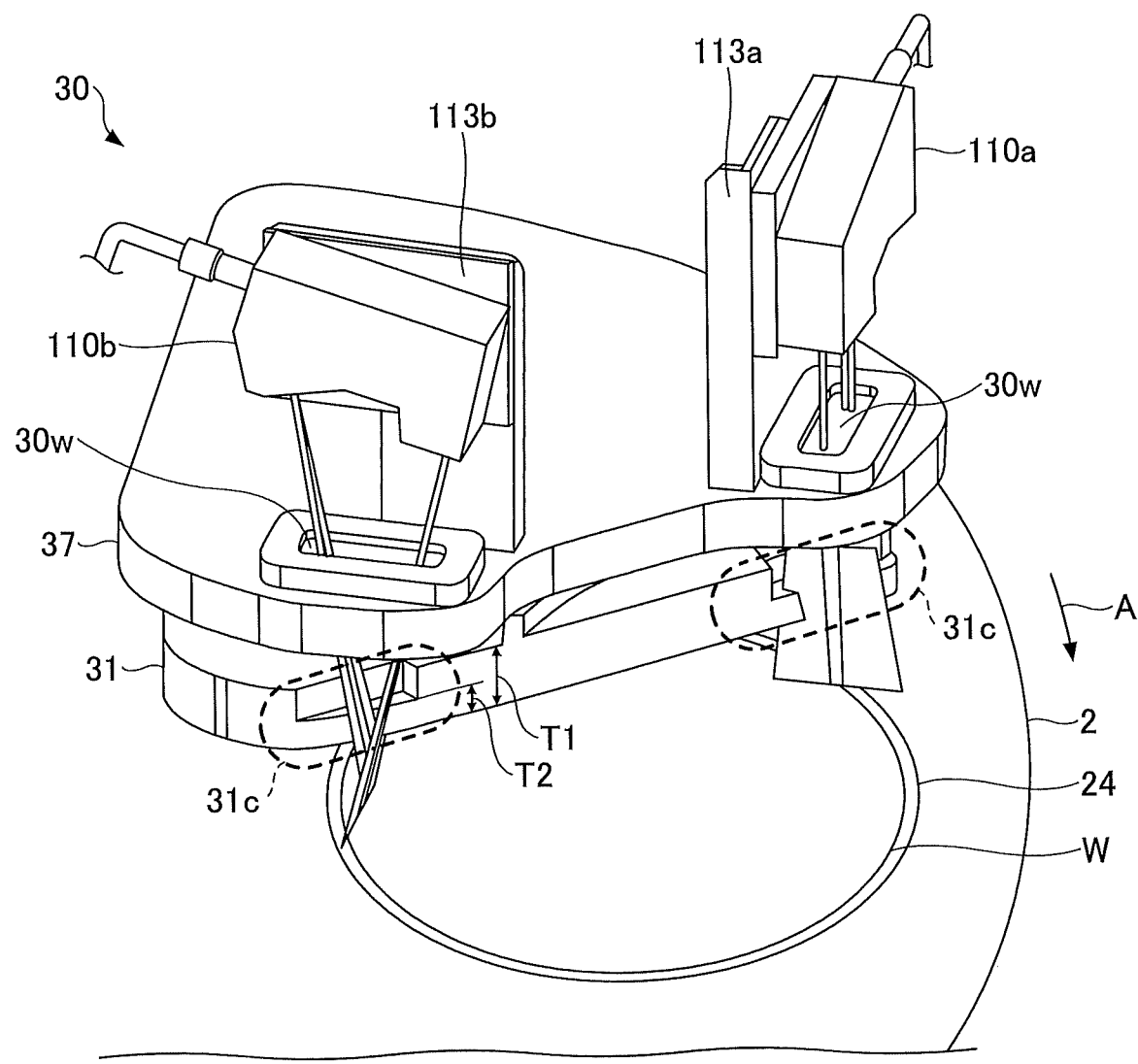
FIG. 6 is a diagram illustrating a positional relationship between laser displacement meters and a bottom plate of a showerhead.

Next, a positional relationship between the bottom plate 31 of the showerhead 30 and the laser displacement meters 110a and 110b in the monitoring device 150 for monitoring a state of the above-described deposition apparatus will be described. FIG. 6 is a diagram illustrating the positional relationship between the laser displacement meters 110a and 110b and the bottom plate 31 of the showerhead 30.

As illustrated in FIG. 6, the showerhead 30 includes the bottom plate 31 and an upper plate 37. The bottom plate 31 and the upper plate 37 are formed of a metallic material such as aluminum. Two steps 31c each having a non-specular surface are formed in the periphery of the bottom plate 31 on a downstream side of the rotational direction (arrow A of FIG. 6) of the rotary table 2. The first one of the steps 31c is provided at an inner side in the radial direction of the rotary table 2, and the second one of the steps 31c is provided at an outer side in the radial direction of the rotary table 2. A thickness T2 of each of the steps 31c is less than a thickness T1 of the bottom plate 31. Preferably, the thickness T2 may be, for example, half or less than half of the thickness T1. Accordingly, a difference between a height of an upper surface of the step 31c and a height of the upper surface of the rotary table 2 is reduced, and detection accuracy by the laser displacement meters 110a and 110b is improved.

Two windows 30w are provided in the upper plate 37, on the downstream side of the rotational direction of the rotary table 2. One of the windows 30w is provided at an inner side in the radial direction of the rotary table 2, and the other one of the windows 30w is provided at an outer side in the radial direction of the rotary table 2. Each of the windows 30w is configured such that the interior of the vacuum vessel 1 can be seen from outside through the windows 30w, by providing, for example, quartz glass at the windows 30w. Each of the windows 30w is provided at a position corresponding to the step 31c formed in the bottom plate 31. That is, each of the windows 30w is provided such that the window 30w provided in the upper plate 37 overlaps with the step 31c formed in the bottom plate 31, when the showerhead 30 is viewed from above.

The laser displacement meters 110a and 110b are provided above the respective windows 30w. The laser displacement meters 110a and 110b are respectively fixed to supports 113a and 113b each of which is attached to the upper plate 37, such that, for example, an angle of reflection of regular reflection light is in a range of 1 to 179 degrees, preferably 3 to 30 degrees. Each of the laser displacement meters 110a and 110b may be a meter in which a height of the upper surface of the rotary table 2 and a height of the peripheral edge of the bottom plate 31 (i.e. height of the upper surface of the step 31c) of the showerhead 30 can be simultaneously detected, for example, a two-dimensional laser displacement meter.

Figure 7:
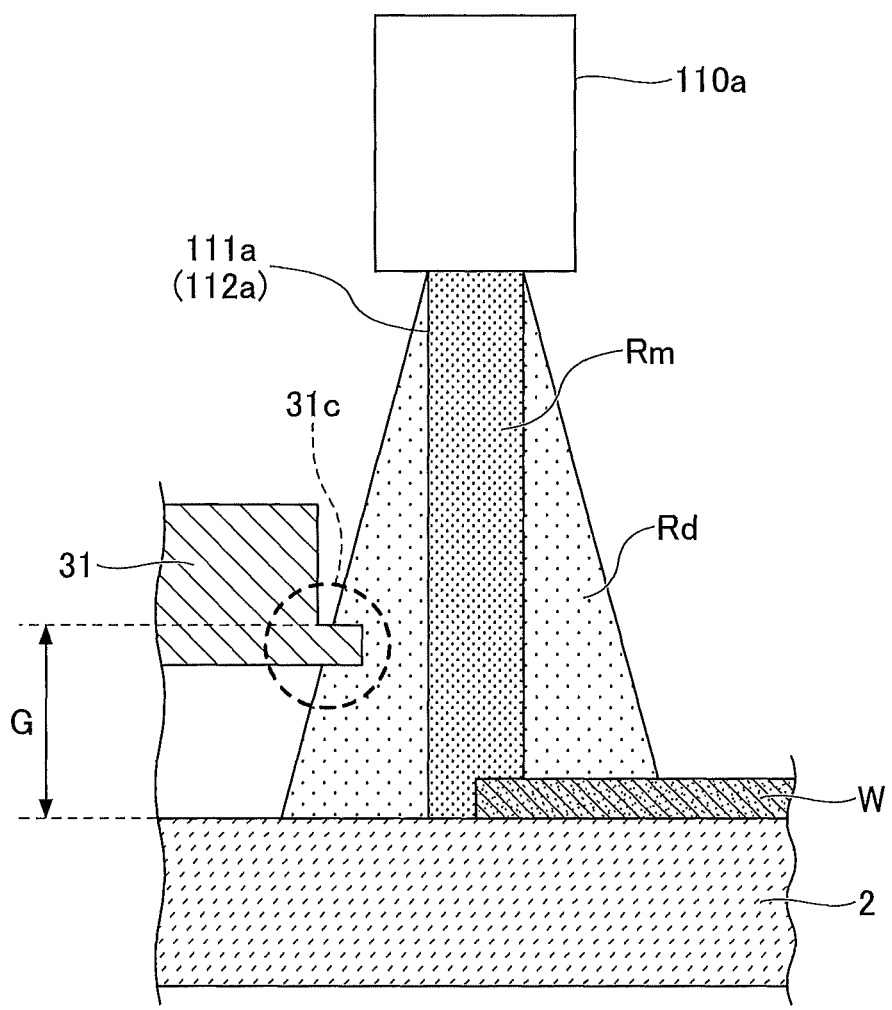
FIG. 7 is a diagram for explaining a principle of measuring height by the laser displacement meter.

Next, a principle of measuring height by the laser displacement meter 110a will be described. As a principle of measuring height by the laser displacement meter 110b is the same as that by the laser displacement meter 110a, description of the principle of measuring height by the laser displacement meter 110b is omitted. FIG. 7 is a diagram for explaining the principle of measuring height by the laser displacement meter 110a, and illustrates a cross-section along a concentric circle of the rotary table 2, including a part of the bottom plate 31 of the showerhead 30. In FIG. 7, only the rotary table 2, the bottom plate 31, the laser displacement meter 110a, and the wafer W are illustrated, while other components are not illustrated. In FIG. 7, regular reflection light is indicated by a symbol "Rm", and diffused reflection light is indicated by a symbol "Rd".

As illustrated in FIG. 7, the laser displacement meter 110a causes laser light emitted from the light emitting section 111a to be reflected on the upper surface of the wafer W, and causes the regular reflection light Rm to enter the light receiving section 112a. At the same time, the laser displacement meter 110a causes the laser light emitted from the light emitting section 111a to be reflected on the upper surface of the rotary table 2 and on the step 31c of the bottom plate 31, and causes the diffused reflection light Rd to enter the light receiving section 112a. The laser displacement meter 110a and other related components are configured such that the regular reflection light Rm from the wafer W is not blocked by the steps 31c of the bottom plate 31. Therefore, the height of the upper surface of the rotary table 2, the height of the upper surface of the step 31c of the bottom plate 31, and the height of the upper surface of the wafer W can be measured simultaneously. Note that, in the following description, the height of the upper surface of the step 31c may also be referred to a "height of the step 31c".

The computing device 120 calculates a distance G between the upper surface of the rotary table 2 and the steps 31c of the bottom plate 31, based on information of the height (may also be referred to as "height information") of the rotary table 2 measured by the laser displacement meter 110a and height information of the steps 31c of the bottom plate 31 measured by the laser displacement meter 110a. The computing device 120 also receives a signal from the encoder 25, to identify from which position on the rotary table 2 the distance to the bottom plate 31 has been calculated when the height of the rotary table 2 and the height of the step 31c of the bottom plate 31 have been measured.

Figure 8:
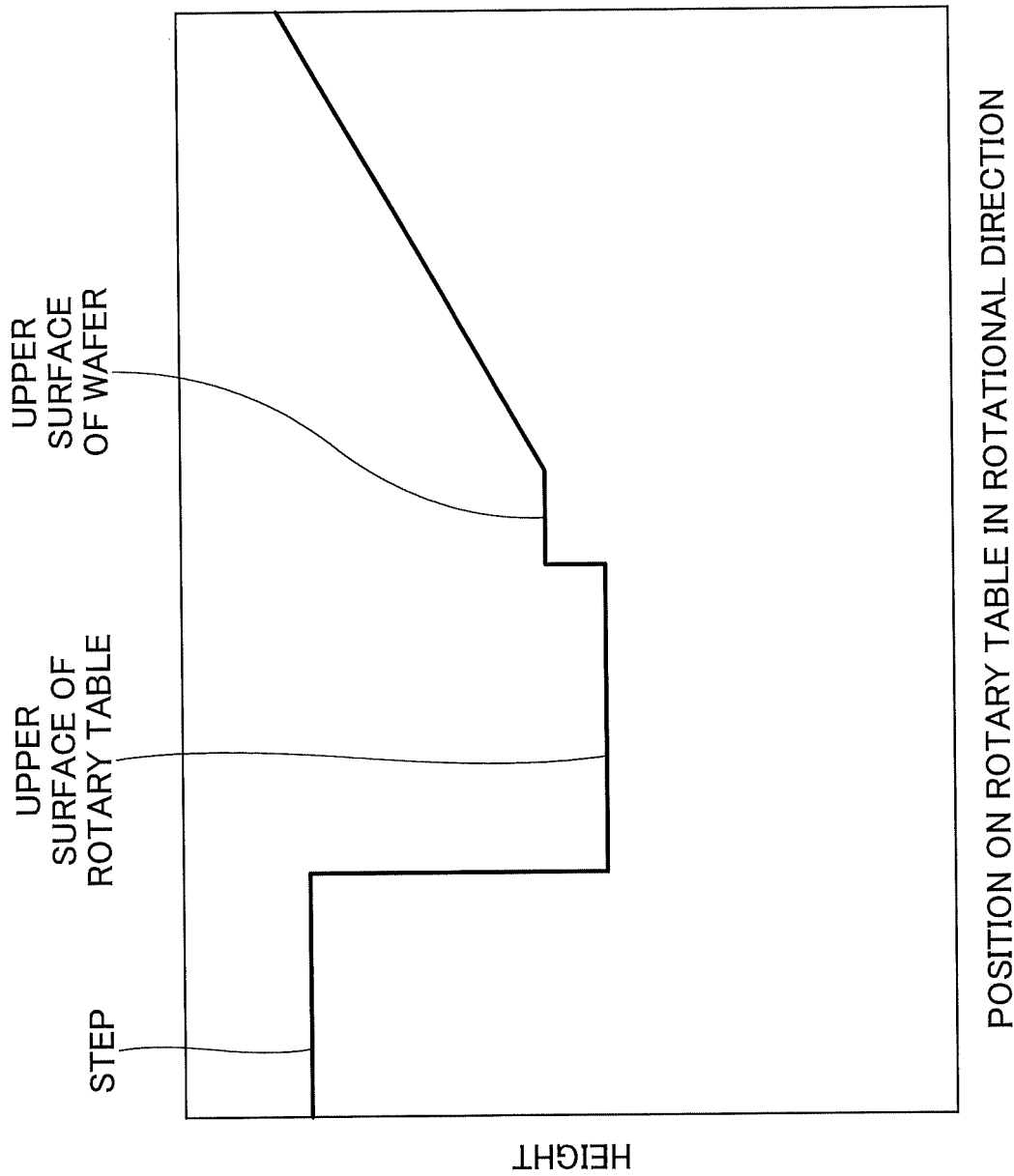
FIG. 8 is a diagram illustrating an example of height position data measured by the laser displacement meter.

FIG. 8 is a diagram illustrating an example of height position data measured by the laser displacement meter 110a. In FIG. 8, the horizontal axis indicates a position on the circumference of the rotary table 2 in the rotational direction of the rotary table 2, and the vertical axis indicates height measured by the laser displacement meter 110a. As illustrated in FIG. 8, according to the laser displacement meter 110a, height of the upper surface of the rotary table 2, height of the step 31c of the bottom plate 31, and height of the upper surface of the wafer W can be measured simultaneously.

Further, parameters of the laser displacement meter 110a when measuring the height of the upper surface of the rotary table 2 and the height of the step 31c of the bottom plate 31 may be different from parameters of the laser displacement meter 110a when measuring the height of the upper surface of the wafer W. For example, light quantity emitted from the light emitting section 111a when measuring the height of the upper surface of the rotary table 2 and the step 31c of the bottom plate 31 may be set higher than that when measuring the height of the upper surface of the wafer W. In addition, for example, shutter speed of the laser displacement meter 110a when measuring the height of the upper surface of the rotary table 2 and the steps 31c of the bottom plate 31 may be set slower than that when measuring the height of the upper surface of the wafer W. Therefore, when the height of the upper surface of the rotary table 2 and the step 31c of the bottom plate 31 is measured, the light quantity of the diffused reflection light that the light receiving section 112a receives can be increased. Therefore, accuracy of the height of the upper surface of the rotary table 2 and the step 31c of the bottom plate 31 measured by the laser displacement meter 110a improves. Such adjustment of the parameters of the laser displacement meter 110a may be performed, for example, by the controller 100.

More specifically, the controller 100 rotates the rotary table 2 the predetermined number of times while causing the laser displacement meter 110a to emit laser light of a first light quantity, to measure the height of the upper surface of the rotary table 2 and the height of the steps 31c of the bottom plate 31. Subsequently, the controller 100 rotates the rotary table by the predetermined number of times while causing the laser displacement meter 110a to emit laser light of a second light quantity lower than the first light quantity, to measure the height of the upper surface of the wafer W.

Thus, according to the deposition apparatus of the present embodiment, the height of the rotary table 2, the height of the showerhead 30, and the height of the wafer W are detected by a single laser displacement meter 110a (or laser displacement meter 110b). Thus, by using the detected heights of the rotary table 2, the showerhead 30, and the wafer W, a status of the deposition apparatus can be monitored. As a result, it is possible to operate the deposition apparatus stably.

Specifically, by monitoring a gap calculated based on the height of the rotary table 2 and the height of the showerhead 30, quality of film formed by a deposition process can be managed. Further, by monitoring bending of a wafer W based on a height of the wafer W, it is possible to prevent occurrence of detachment of a wafer W from the recess 24 of the rotary table 2. Details of a method of monitoring the gap and a method of monitoring bending of a wafer W will be described below.

Further, by accumulating data of the height of the rotary table 2, the height of the showerhead 30, and the height of the wafer W, detected by the laser displacement meter 110a (or the laser displacement meter 110b), in the memory device 130 as time series data, errors between runs can be managed quantitatively. In addition, errors among materials and among operators can be managed quantitatively. As a result, automatic maintenance and automatic tuning of the deposition apparatus is possible.

Further, among the deposition apparatuses having the same specification, by comparing the data of the height of the rotary table 2, the height of the showerhead 30, and the height of the wafer W, detected by the laser displacement meter 110a (or the laser displacement meter 110b), differences in states of the deposition apparatuses can be recognized easily. For example, by adjusting the showerhead 30 so as to reduce differences in states of the deposition apparatuses, differences among the deposition apparatuses can be reduced.

Further, by evaluating the data of the height of the rotary table 2, the height of the showerhead 30, and the height of the wafer W, detected by the laser displacement meter 110a (or the laser displacement meter 110b) in association with conditions of the deposition process, improvement of a yield rate can be expected.

<Tilt Acquisition Process>

Figure 9:
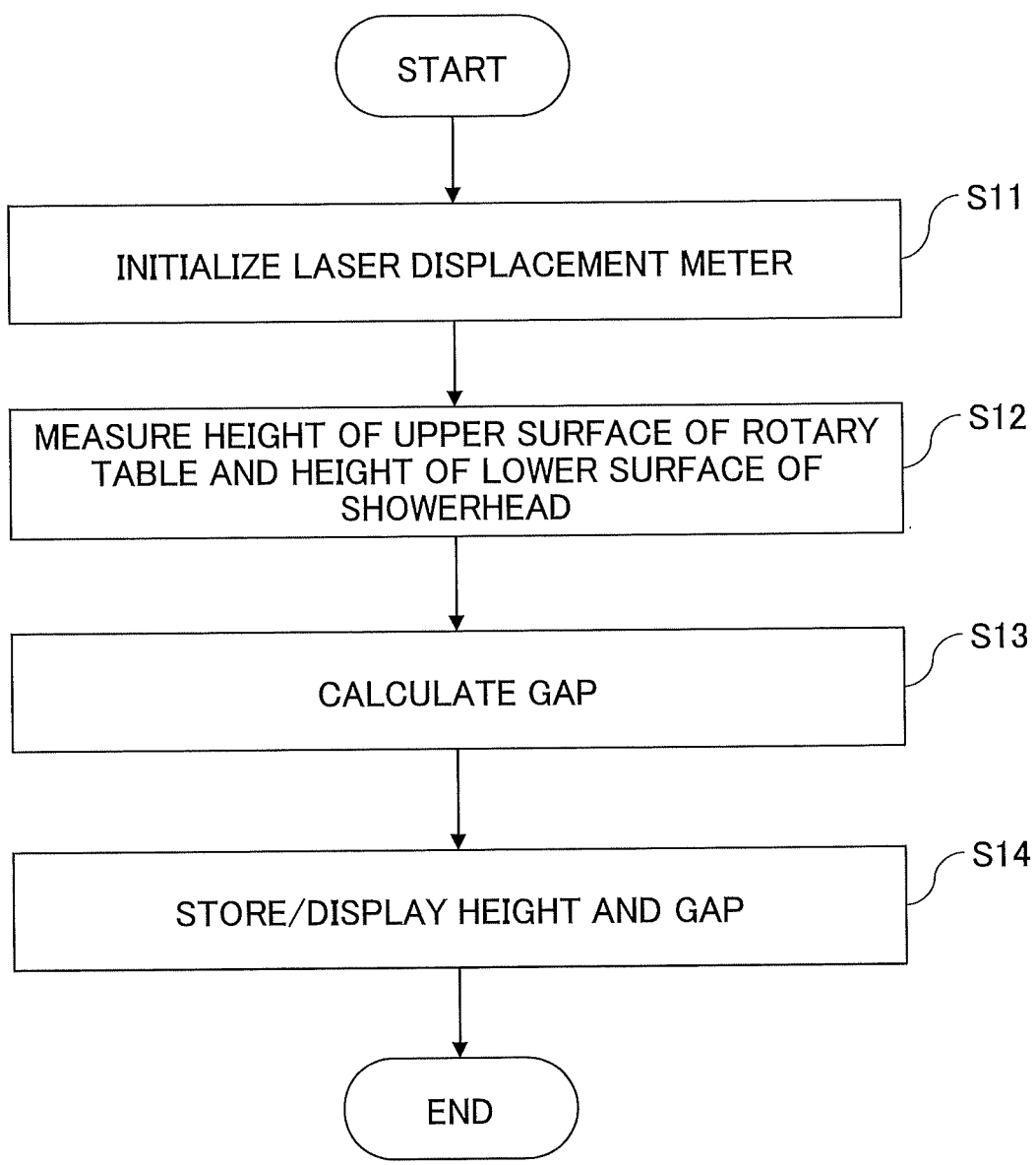
FIG. 9 is a flowchart illustrating an example of a tilt acquisition process.
Figure 10:
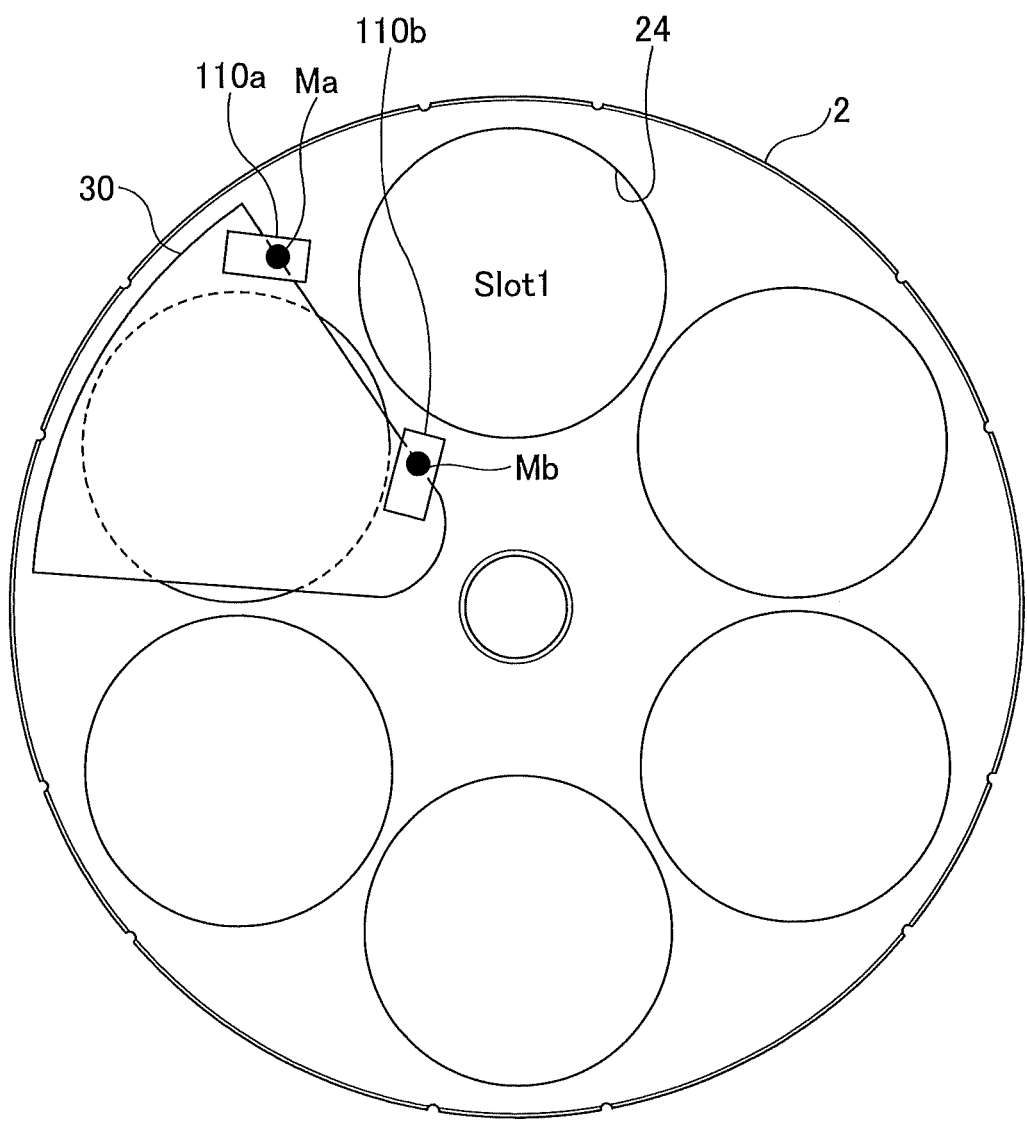
FIG. 10 is a diagram illustrating an example of height measurement positions that are measured in the tilt acquisition process.

Next, a process of acquiring a tilt of the showerhead 30 (hereinafter referred to as a "tilt acquisition process") will be described. The tilt acquisition process is performed when the controller 100 receives an operation to start the tilt acquisition process from a user (e.g. operator of the deposition apparatus). FIG. 9 is a flowchart illustrating an example of the tilt acquisition process. FIG. 10 is a diagram illustrating an example of positions (may also be referred to as "height measurement positions") that are measured in the tilt acquisition process.

In step S11, the controller 100 performs initialization of the laser displacement meters 110a and 110b. The controller 100 may perform calibration or the like of the laser displacement meters 110a and 110b.

In step S12, the controller 100 stops the rotary table 2 at a predetermined position, and measures the height of the upper surface of the rotary table 2 and the height of the lower surface of the showerhead 30 by the laser displacement meters 110a and 110b. Note that the lower surface of the showerhead 30 is the lower surface of the bottom plate 31.

In the present embodiment, the laser displacement meters 110a and 110b respectively emit laser light from the light emitting sections 111a and 111b, and receive diffused reflection light from the upper surface of the rotary table 2 and from the steps 31c of the bottom plate 31 with the light receiving sections 112a and 112b. Accordingly, the height of the upper surface of the rotary table 2 and the height of the step 31c of the bottom plate 31 is measured. Further, the computing device 120 calculates the height of the lower surface of the showerhead 30 based on the height of the step 31c measured by the laser displacement meters 110a and 110b and based on a distance between the upper surface of the step 31c and the lower surface of the showerhead 30 that is stored in the memory device 130 in advance. Note that the laser displacement meters 110a and 110b measure height from the predetermined reference surface, as described above. The predetermined position may be, for example, a position at which the laser displacement meters 110a and 110b do not overlap with the recess 24 on the rotary table 2 in the plan view, as illustrated in FIG. 10. In FIG. 10, positions on the rotary table 2, at which the height is measured by the laser displacement meters 110a and 110b, are indicated by a symbol Ma and a symbol Mb, respectively.

In step S13, the computing device 120 calculates a gap, which is a distance between the upper surface of the rotary table 2 and the lower surface of the showerhead 30, based on the height of the upper surface of the rotary table 2 and the height of the lower surface of the showerhead 30 that are obtained in step S12.

Figure 11:
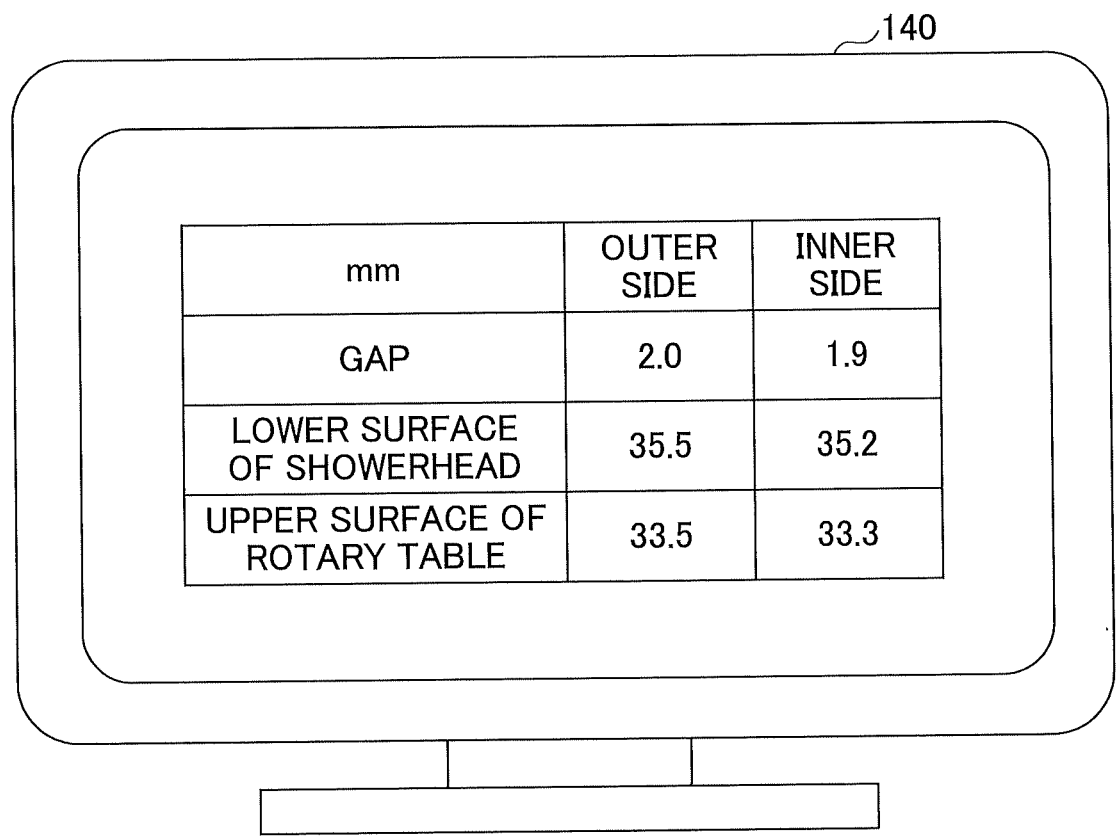
FIG. 11 is a diagram illustrating an example of an image displayed on a display device in the tilt acquisition process.

In step S14, the computing device 120 stores the gap calculated in step S13 and the height of the upper surface of the rotary table 2 and the height of the lower surface of the showerhead 30 that are measured in step S12, into the memory device 130, and displays the gap, the height of the upper surface of the rotary table 2, and the height of the lower surface of the showerhead 30 on a display device 140 connected to the computing device 120. FIG. 11 is a diagram illustrating an example of an image displayed on the display device 140 in the tilt acquisition process. In the example of FIG. 11, the display device 140 displays that, on the outer side (a side closer to the outer circumference of the rotary table 2), the gap is 2.0 mm, the height of the lower surface of the showerhead 30 from the reference surface is 35.5 mm, and the height of the upper surface of the rotary table 2 from the reference surface is 33.5 mm. Further, the display device 140 displays that, on the inner side (a side closer to the rotational center of the rotary table 2), the gap is 1.9 mm, the height of the lower surface of the showerhead 30 from the reference surface is 35.2 mm, and the height of the upper surface of the rotary table 2 from the reference surface is 33.3 mm. After step S13 is completed, the tilt acquisition process terminates.

Thus, according to the tilt acquisition process of the present embodiment, because the gap can be calculated based on the diffused reflection light, a tilt of the showerhead 30 can be acquired regardless of presence or absence of the wafer W on the rotary table 2. Thus, it is possible to recognize a tilt of the showerhead 30 in a variety of situations, such as when starting the deposition apparatus, when performing maintenance, when adjusting the showerhead, and when performing the deposition process. Therefore, it is possible to quickly adjust the tilt of the showerhead 30, and the deposition apparatus can operate stably. In particular, in the deposition apparatus equipped with the showerhead 30, because the gap is an important control dimension (parameter) with respect to quality of film to be deposited, if the gap can be calculated while performing the deposition process, it contributes to improvement of reproducibility of the deposition process.

Further, according to the tilt acquisition process of the present embodiment, because both the gap on the outer side of the rotary table 2 in the radial direction, and the gap on the inner side of the rotary table 2 in the radial direction are displayed on the display device 140, the user can easily recognize the tilt of the showerhead 30 by checking displayed contents on the display device 140. In the example of FIG. 11, as the user can recognize that the gap on the outer side is greater than the gap on the inner side by checking the display device 140, the user can adjust the tilt of the showerhead 30, for example, such that a difference in the gap between the outer side and the inner side is reduced.

In addition, by performing a tilt acquisition process, for example, before and after the maintenance of the deposition apparatus, the gap before and after the maintenance of the deposition apparatus may be compared. As a result, the user can adjust the tilt of the showerhead 30 such that the gap after the maintenance becomes the same as the gap before the maintenance.

Further, in the tilt acquisition process according to the present embodiment, after the computing device 120 stores the gap calculated in step S13 into the memory device 130 and displays the gap in the display device 140, the tilt acquisition process terminates. However, the tilt acquisition process is not limited thereto. For example, after the computing device 120 stores the gap calculated in step S13 into the memory device 130 and displays the gap on the display device 140, the computing device 120 may determine whether adjustment of the gap is necessary, based on the result of calculation of the gap. Further, in a case in which the deposition apparatus includes a gap adjustment mechanism for automatically adjusting the gap, the controller 100 may be configured to control the gap adjustment mechanism based on the determination result by the computing device 120, to automatically adjust the gap. By the gap being adjusted automatically, manpower saving is expected.

<Gap Measurement Process>

Next, a process for measuring gaps (hereinafter referred to as a "gap measurement process") will be described. The gap measurement process is performed, for example, when the rotary table 2 is intermittently rotated at a low speed to place the wafers W onto the respective recesses 24, or during the deposition process to the wafers W while the wafers W are placed on the respective recesses 24 of the rotary table 2.

Figure 12:
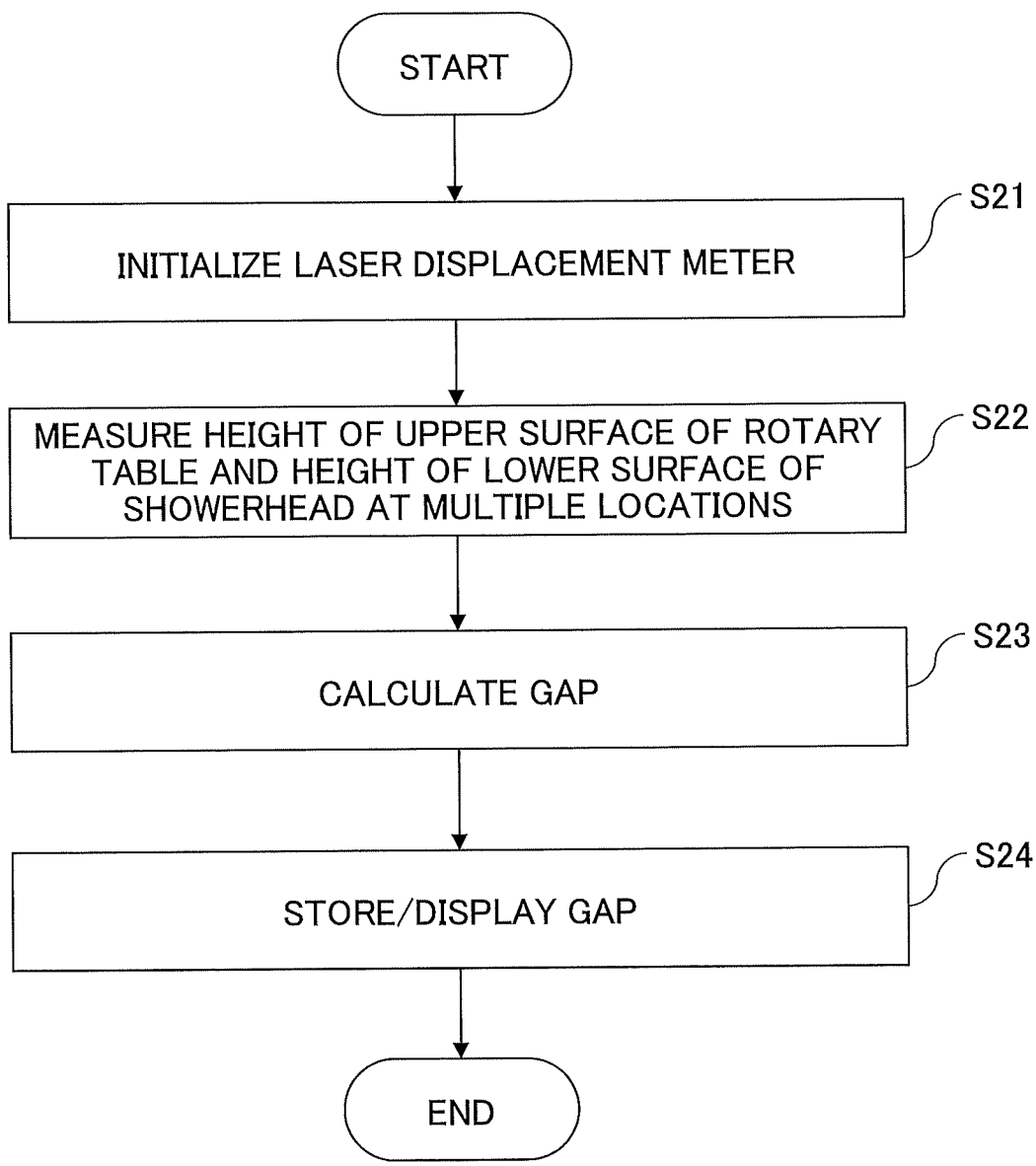
FIG. 12 is a flowchart illustrating an example of a gap measurement process.
Figure 13:
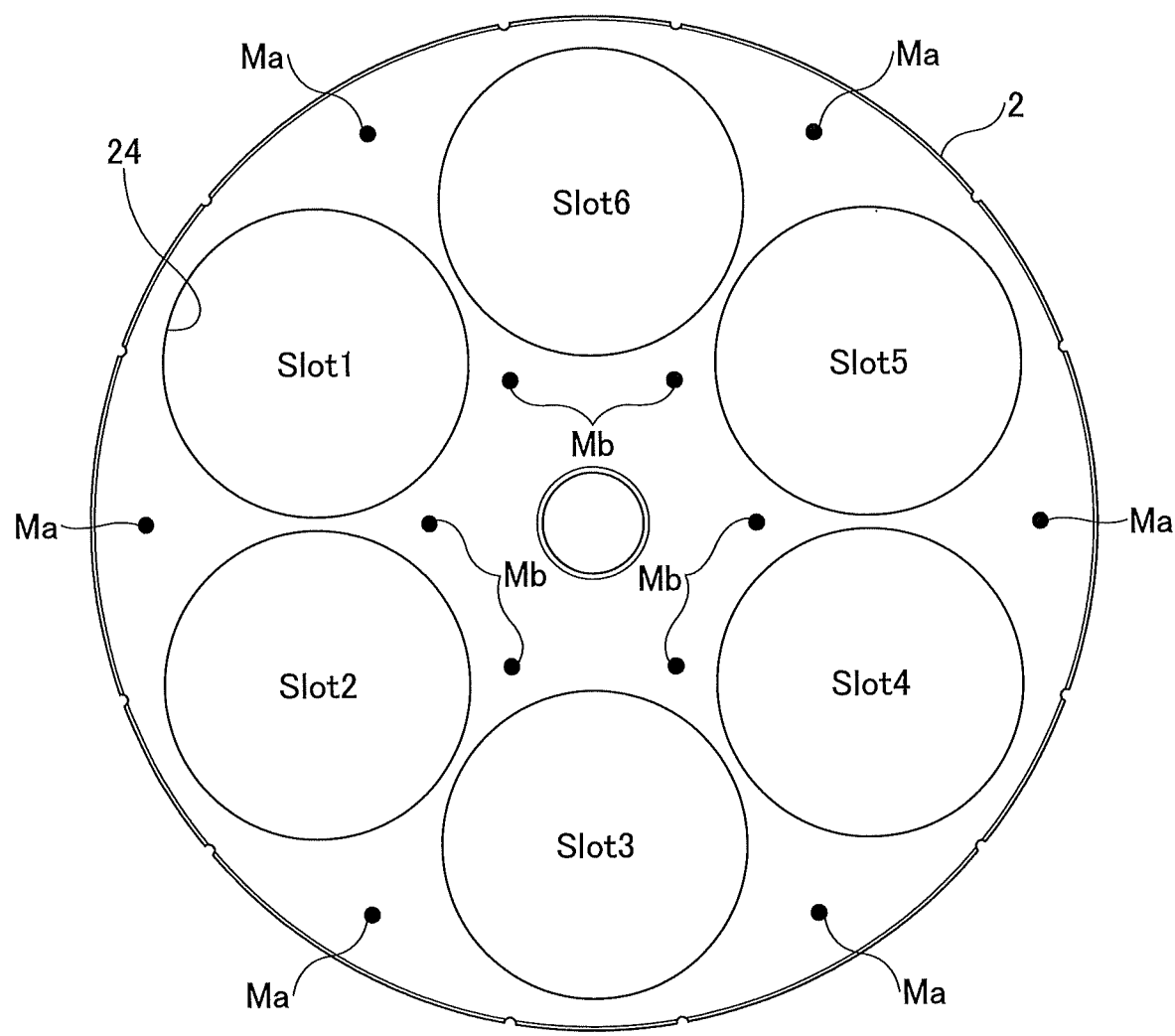
FIG. 13 is a diagram illustrating an example of the height measurement positions that are measured in the gap measurement process.

FIG. 12 is a flowchart illustrating an example of the gap measurement process. FIG. 13 is a diagram illustrating an example of the height measurement positions that are measured in the gap measurement process.

In step S21, the controller 100 performs initialization of the laser displacement meters 110a and 110b. The controller 100 may perform calibration or the like of the laser displacement meters 110a and 110b.

In step S22, the controller 100 measures the height of the upper surface of the rotary table 2 and the height of the lower surface of the showerhead 30 by the laser displacement meters 110a and 110b at multiple locations on the rotary table 2.

In the present embodiment, the controller 100 intermittently rotates the rotary table 2 while irradiating the rotary table 2 with the laser displacement meters 110a and 110b, and causes the light receiving sections 112a and 112b to receive the diffused reflection light from the upper surface of the rotary table 2 and from the upper surface of the steps 31c of the bottom plate 31. Accordingly, the height of the upper surface of the rotary table 2 and the height of the step 31c of the bottom plate 31 are measured. In addition, the computing device 120 calculates the height of the lower surface of the showerhead 30 based on the height of the step 31c measured by the laser displacement meters 110a and 110b and the distance between the upper surface of the step 31c and the lower surface of the showerhead 30 that is stored in the memory device 130 in advance. Note that the multiple locations are distributed on the rotary table 2 in the rotational direction of the rotary table 2. For example, the multiple locations may be intermediate locations of two adjacent slots in a case in which six recesses (slots 1 to 6) are formed in the rotary table 2 as illustrated in FIG. 13. In FIG. 13, the locations on the rotary table 2 at which the height is measured by the laser displacement meters 110a and 110b are indicated by a symbol Ma and a symbol Mb, respectively.

In step S23, the computing device 120 computes the gap at each of the locations at which the measurement is performed, based on the height of the upper surface of the rotary table 2 and the height of the lower surface of the showerhead 30 that are obtained in step S22. In the example of FIG. 13, the computing device 120 computes gaps at locations between the slot 1 and the slot 2, between the slot 2 and the slot 3, between the slot 3 and the slot 4, between the slot 4 and the slot 5, between the slot 5 and the slot 6, and between the slot 6 and the slot 1, on the outer and inner sides of the rotary table 2. That is, in the example of FIG. 13, the computing device 120 computes 12 gaps. The computing device 120 may calculate an average value of the above-described 12 gaps between the slots.

Figure 14A:
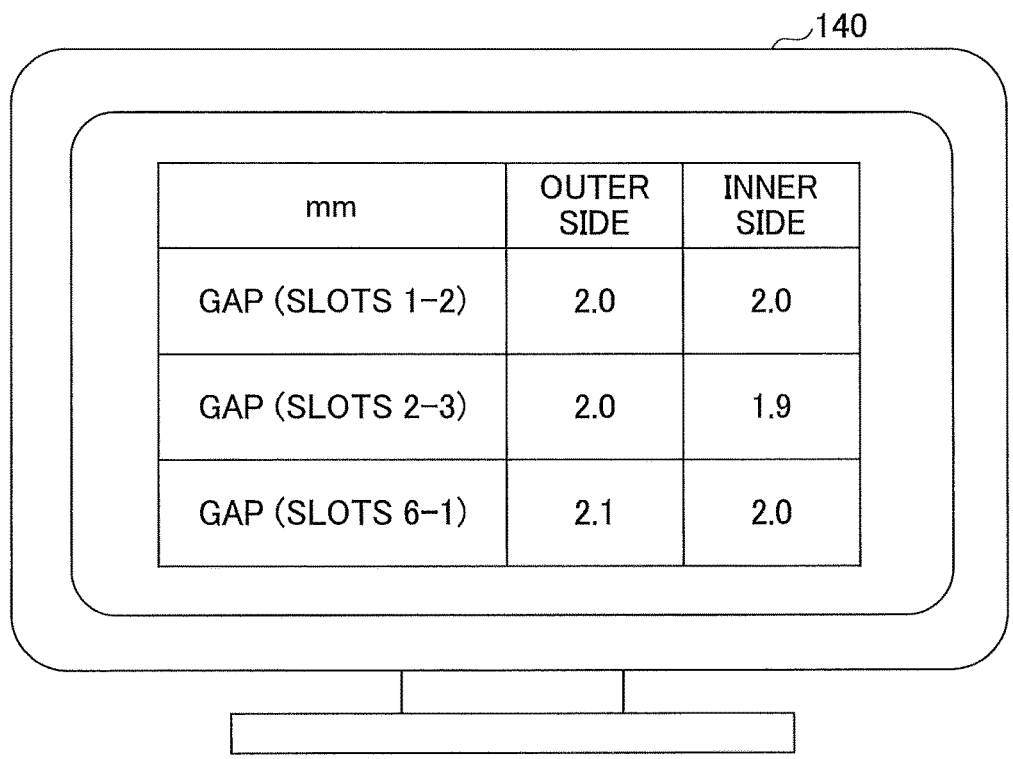
FIGS. 14A and 14B illustrate examples of images displayed on the display device in the gap measurement process.
Figure 14B:
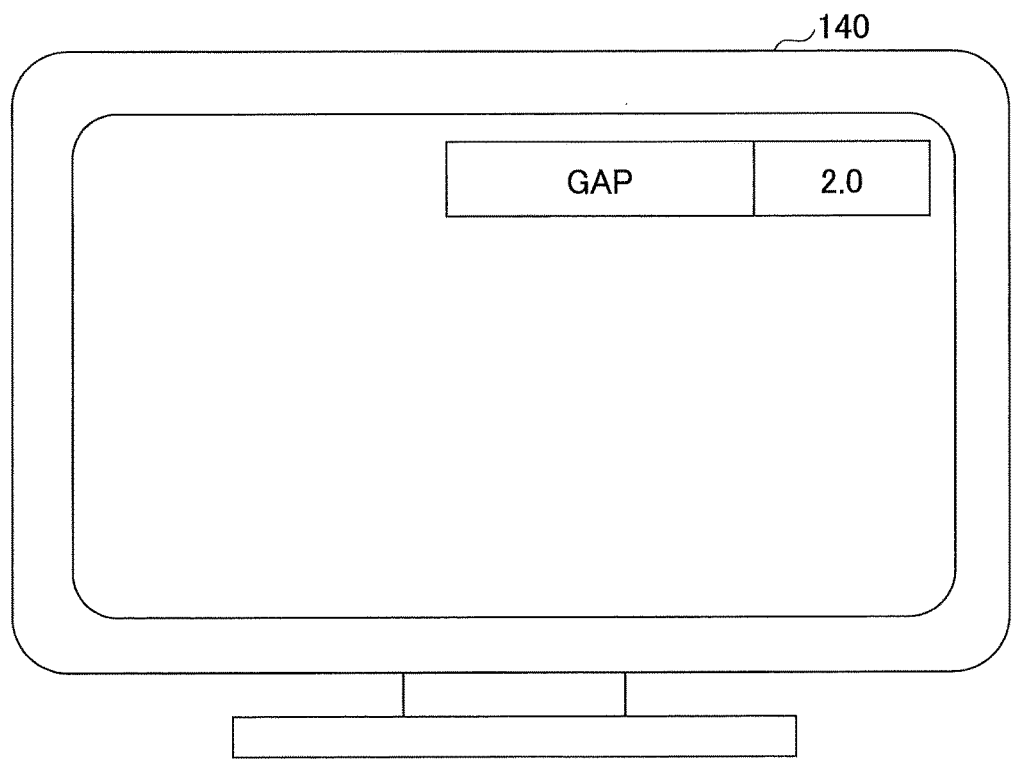

In step S24, the computing device 120 stores the gaps calculated in step S23 into the memory device 130, and displays the gaps on the display device 140. FIGS. 14A and 14B illustrate examples of images displayed on the display device 140 in the gap measurement process. In the example of FIG. 14A, the display device 140 indicates that the gap on the outer side between the slot 1 and the slot 2 and gap on the inner side between the slot 1 and the slot 2 are 2.0 mm and 2.0 mm, respectively. Further, the display device 140 indicates that the gap on the outer side between the slot 2 and the slot 3 and the gap on the inner side between the slot 2 and the slot 3 are 2.0 mm and 1.9 mm, respectively. Further, the display device 140 displays that the gap on the outer side between the slot 6 and the slot 1 and the gap on the inner side between the slot 6 and the slot 1 are 2.1 mm and 2.0 mm, respectively. The example of FIG. 14B indicates that the average value of the above-described twelve gaps between the slots is 2.0 mm. In another embodiment, the computing device 120 may display the gaps of the multiple locations and the average value of the gaps simultaneously on a single screen of the display device 140. That is, on a screen of the display device 140 in which multiple gaps are displayed, as illustrated in the example of FIG. 14A, the average value of the multiple gaps may also be displayed. After step S23 is completed, the gap measurement process terminates.

As described above, according to the gap measurement process of the present embodiment, because the gaps can be calculated based on the diffused reflection light, the gaps can be obtained regardless of presence or absence of the wafer W on the rotary table 2. Thus, it is possible to obtain the gaps in various situations, such as when starting up the deposition apparatus, when performing maintenance, when adjusting the showerhead, and when performing the deposition process. Therefore, it is possible to quickly adjust the gaps, and the deposition apparatus can operate stably.

Further, according to the gap measurement process of the present embodiment, as the display device 140 displays the gaps of the respective locations, the average value of the gaps of the respective locations, and the like, the user can easily identify the gap of each of the locations and the average value of the gaps, by checking the display device 140. In the example of FIG. 14A, by checking the display device 140, because the user can recognize that the gaps between the slots 1 and 2, between the slots 2 and 3, and between the slots 6 and 1 are almost the same on both the outer side and the inner side, the user can determine that adjustment of the gaps (gap adjustment) is not required.

In the gap measurement process according to the present embodiment, after the gaps calculated in step S23 are stored in the memory device 130 and are displayed on the display device 140 by the computing device 120, the gap measurement process terminates. However, the gap measurement process is not limited thereto. For example, after the computing device 120 stores the gaps calculated in step S23 in the memory device 130 and displays the gaps on the display device 140, the computing device 120 may determine whether or not gap adjustment is necessary based on the result of calculation of the gaps. Further, in a case in which the deposition apparatus includes the gap adjustment mechanism for automatically adjusting the gaps, the controller 100 may be configured to control the gap adjustment mechanism based on the determination result by the computing device 120, to automatically adjust the gaps. By the gap being adjusted automatically, manpower saving is expected.

<Bend Monitoring Process>

Figure 15:
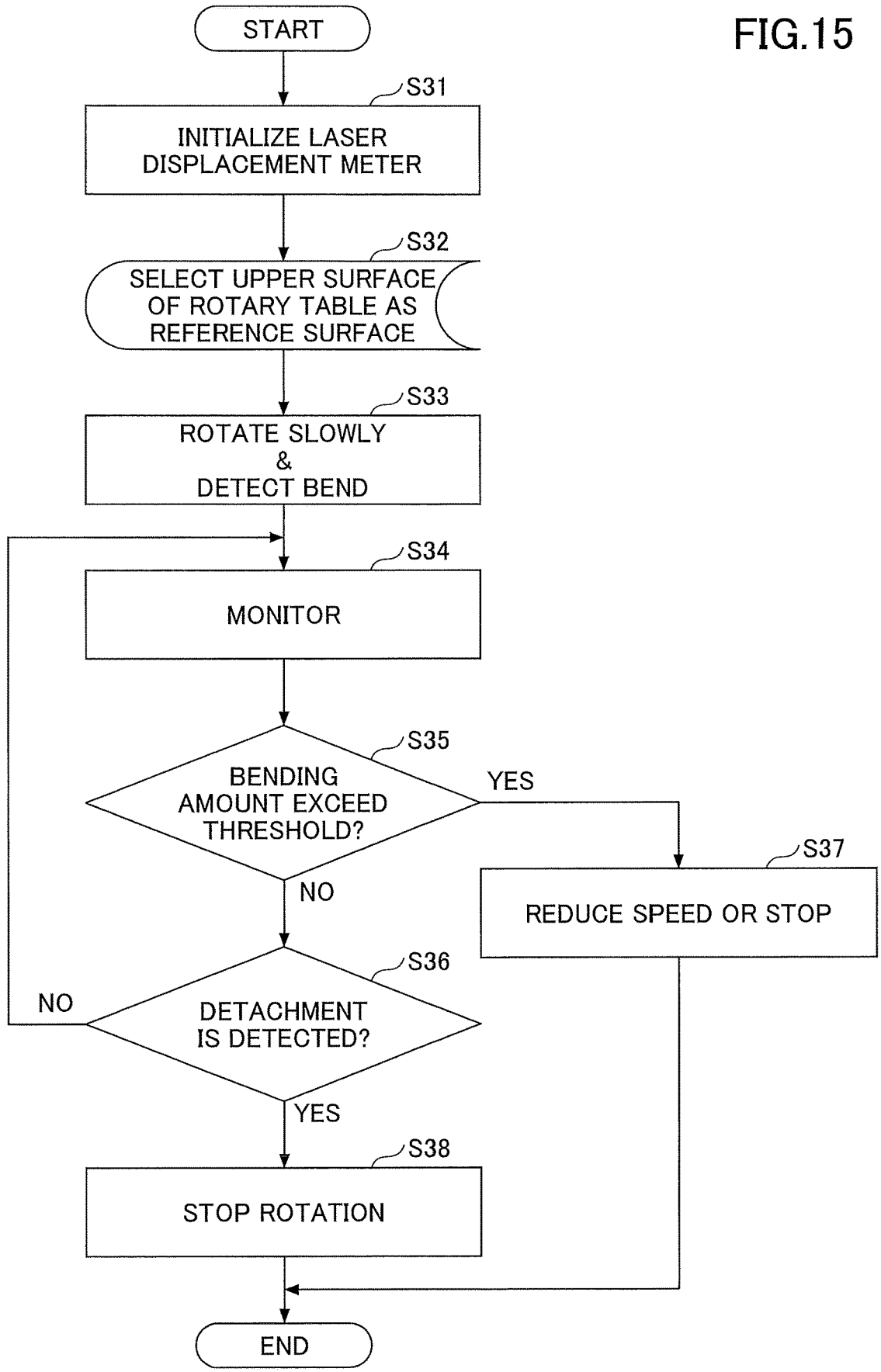
FIG. 15 is a flowchart illustrating an example of the bend monitoring process.

Next, a process of monitoring a bend of a wafer W (hereinafter referred to as a "bend monitoring process") will be described. The bend monitoring process can be performed at any time while a wafer W is placed on the recess 24 of the rotary table 2. FIG. 15 is a flowchart illustrating an example of the bend monitoring process.

In step S31, the controller 100 performs initialization of the laser displacement meters 110a and 110b. The controller 100 may perform calibration or the like of the laser displacement meters 110a and 110b.

In step S32, the upper surface of the rotary table 2 is selected as the reference surface, and laser light is irradiated onto the surface of the rotary table 2, and a measurement value is acquired. The acquired measurement value is stored into the memory device 130 as a reference value.

In step S33, the rotary table 2 is intermittently rotated at a low speed, and at each of the recesses 24, detection is performed as to whether or not the bend of wafers W is within a control limit. As a temperature in the vacuum vessel 1 is high, when a wafer W is loaded into the vacuum vessel 1 and placed on the recess 24, the wafer W often bends. Therefore, detection of the bend in an initial stage is performed in step S33. When the bend of each of the wafers W becomes within the control limit such that the rotary table 2 can be rotated, execution of step S33 ends.

In addition, in either step S32 or step S33, or before or after step S32 or step S33, preparations (operations) necessary for processing a substrate, such as vacuum evacuation of the vacuum vessel 1, heating of the heater unit 7, supply of the separation gas, and supply of the reactant gas, are performed, in accordance with types of processing to the substrate.

In step S34, the controller 100 starts rotating the rotary table 2, and monitoring a bend of the wafer W is performed constantly. Specifically, by the laser displacement meters 110a and 110b, measurement of a surface profile of each of the wafers W is performed constantly at each location. At this time, the measured value of the reference surface acquired in step S32 is used as the reference value as necessary, to calculate a bending amount of the wafer W.

In step S35, it is determined whether or not the bending amount that is calculated in step S34 exceeds a predetermined threshold value. This determination as described above is performed by the computing device 120. The threshold shall be set to a level in which possibility of detachment of a wafer occurs when the bending amount exceeds the level and in which the detachment does not actually occur yet. This can prevent occurrence of detachment. In addition, this determination is performed for all of the wafers W. If the bending amount of at least one of the wafers W has exceeded the threshold, it is determined in step S35 that the bending amount exceeds the threshold value (e.g., the determination in steps S35 becomes affirmative). If it is determined in step S35 that the calculated bending amount exceeds the threshold value, the bend monitoring process proceeds to step S37. Note that the wafer W in which the bending amount exceeds the threshold can be specified by using an output of the encoder 25.

In step S37, rotating speed of the rotary table 2 is reduced, or the rotation of the rotary table 2 is stopped. If the bending amount exceeds the predetermined threshold, the rotating speed of the rotary table 2 is reduced, or the rotation of the rotary table 2 is stopped, because the wafer W is likely to be detached from the recess 24. Whether the rotary table 2 should decelerate or should be stopped may be determined by comparing the bending amount with two threshold values each having different magnitude in step S35, or may be determined by considering other factors.

After step S37 is executed, the bend monitoring process terminates. Thereafter, the wafers W are unloaded from the vacuum vessel 1, and subsequent processing, such as processing of other lots, or processing to find out cause, is performed.

If it is determined, in step S35, that the calculated bending amount of the wafer W does not exceed the threshold, the bend monitoring process proceeds to step S36.

In step S36, it is determined whether detachment of a wafer W has been detected. Determination of detachment of a wafer W may be performed by checking whether or not a surface of the recess 24 on which the wafer W should be placed is exposed. In a case in which the rotary table 2 is formed of quartz, if a measured value of laser reflected from a recess 24 is extremely small, it can be determined that a wafer W is detached from the recess 24. Such determination is performed by the computing device 120. If the detachment of the wafer W from the recess 24 is detected in step S36, the bend monitoring process proceeds to step S38.

In step S38, the rotation of the rotary table 2 is stopped. In the case of occurrence of detachment, the rotary table 2 is stopped immediately rather than slowing down the rotary table 2 so as to minimize damage to the interior of the vacuum vessel 1 and the wafer W.

After step S38 is executed, the bend monitoring process terminates, and necessary steps such as checking for damage to the vacuum vessel 1 and the wafer W are taken.

If the detachment of a wafer W is detected in step S36, the bend monitoring process returns to step S34, and monitoring of the bend of the wafer is continued. Thereafter, execution of steps S34, S35, and S36 is continuously repeated.

The steps S34 to S36 are performed in parallel with the processing to the substrate (performed while performing the substrate processing). Deceleration or stop of rotation of the rotary table 2, which is performed in step S37 or S38, means that the processing to the substrate is also stopped.

As described above, according to the bend monitoring process of the present embodiment, necessary operations can be performed at a stage in which possibility of detachment of a wafer W is increased. Thus, occurrence of the detachment of the wafer W can be effectively prevented.

In the above-described embodiment, the rotary table 2 is an example of a mounting section, the showerhead 30 is an example of a structure member, and each of the laser displacement meters 110a and 110b is an example of an optical sensor.

The embodiments disclosed herein should be considered to be exemplary in all respects and not limiting. The above embodiments may include omissions, substitutions, or modifications in various forms without departing from the appended claims and spirit thereof.

In the embodiments described above, the structure member is a showerhead 30, but is not limited thereto. The structure member may be, for example, the protruding portion 5, the processing gas nozzle 60, and the separation gas nozzles 41 and 42.

In the above-described embodiment, laser displacement meters are provided above the rotary table 2, on an outer side and an inner side of the rotary table 2 in the radial direction, respectively, but a placement method of the laser displacement meter is not limited thereto. For example, three laser displacement meters may be provided above the rotary table 2, such that the first one is positioned on the outer side, the second one is positioned on the inner side, and the third one is positioned on an intermediate location between the outer side and the inner side. Alternatively, for example, above the rotary table 2, at least one laser displacement meter may be provided on at least the outer side, the inner side, and an intermediate location.

In the above-described embodiments, a case in which an optical sensor is a laser displacement meter has been described, but the optical sensor is not limited thereto. For example, the optical sensor may be an LED displacement meter using LED light, or a displacement meter capable of detecting displacement using lamp light.

What is claimed is:

1. A substrate processing apparatus comprising:
   a rotary table on which a substrate is placed, the rotary table being circular in a plan view normal to the rotary table;
   a showerhead provided above the rotary table so as to face the rotary table and configured to supply a raw material gas to the substrate;
   two separation gas nozzles each configured to discharge separation gas toward the rotary table;
   two projections projecting downwardly toward the rotary table and each having a groove in which a corresponding one of the two separation gas nozzles is disposed; and
   an optical sensor situated over the showerhead,
   wherein the showerhead has a bottom plate and an upper plate situated over the bottom plate, the upper plate having a window formed therein, the showerhead and the bottom plate being interposed between the two projections in a circumferential direction of the rotary table in the plan view,
   wherein the bottom plate includes:
      a bottom surface facing the rotary table, the bottom surface having gas discharge holes formed therein for discharging the raw material gas;
      a center-side edge situated toward a center of the rotary table in the plan view;
      a first edge extending from the center-side edge toward an outer perimeter of the rotary table along a radial direction of the rotary table in the plan view; and
      a second edge extending from the center-side edge toward the outer perimeter of the rotary table along a radial direction of the rotary table in the plan view, the second edge being situated downstream relative to the first edge in a direction of rotation of the rotary table,
   wherein the second edge has a step formed therein, and the step overlaps the window when the showerhead is viewed from above,
   wherein the first edge is an upstream end of the bottom plate in the direction of rotation of the rotary table, and the second edge is a downstream end of the bottom plate in the direction of rotation of the rotary table, the bottom surface of the bottom plate extending from the first edge to the second edge, the optical sensor being positioned on the second edge of the bottom plate in the plan view, the optical sensor and the step of the second edge facing each other through the window, and
   wherein the optical sensor is configured to detect a height of the rotary table, a height of the showerhead, and a height of the substrate, by emitting light from above the showerhead to a predetermined location of the rotary table, the step of the bottom plate, and the substrate, and by receiving reflection light from the rotary table, the step of the bottom plate, and the substrate through the window.

2. The substrate processing apparatus according to claim 1, wherein the optical sensor is a two-dimensional laser displacement meter.

3. The substrate processing apparatus according to claim 1, wherein
   the step is formed in a periphery of the bottom plate.

4. The substrate processing apparatus according to claim 1, wherein the rotary table includes a plurality of substrate mounting areas provided on an upper surface of the rotary table along a circumferential direction of the rotary table, each of the plurality of substrate mounting areas being configured to place the substrate.

5. The substrate processing apparatus according to claim 4, further comprising a plurality of optical sensors each being the optical sensor, wherein the plurality of optical sensors are provided along a radial direction of the rotary table.

6. The substrate processing apparatus according to claim 4, further comprising a controller configured to perform processes including
   (a) rotating the rotary table while causing the optical sensor to emit light of a first light quantity, and
   (b) after step (a), rotating the rotary table while causing the optical sensor to emit light of a second light quantity different from the first light quantity.

7. The substrate processing apparatus according to claim 1, further comprising a computing device configured to calculate a distance between the rotary table and the showerhead based on the height of the rotary table and the height of the showerhead.

8. The substrate processing apparatus according to claim 1, wherein
   the reflection light received from the rotary table and the bottom plate is diffused reflection light, and
   the reflection light received from the substrate is regular reflection light.

9. The substrate processing apparatus according to claim 2, wherein
the step is formed in a periphery of the bottom plate.

10. The substrate processing apparatus according to claim 9, further comprising a computing device configured to calculate a distance between the rotary table and the showerhead based on the height of the rotary table and the height of the showerhead.

11. The substrate processing apparatus according to claim 10, wherein
the reflection light received from the rotary table and the bottom plate is diffused reflection light, and
the reflection light received from the substrate is regular reflection light.

12. The substrate processing apparatus according to claim 11, wherein the rotary table includes a plurality of substrate mounting areas provided on an upper surface of the rotary table along a circumferential direction of the rotary table, each of the plurality of substrate mounting areas being configured to place the substrate.

13. The substrate processing apparatus according to claim 12, further comprising a plurality of optical sensors each being the optical sensor, wherein the plurality of optical sensors are provided along a radial direction of the rotary table.

14. The substrate processing apparatus according to claim 13, further comprising a controller configured to perform processes including
(a) rotating the rotary table while causing the optical sensor to emit light of a first light quantity, and
(b) after step (a), rotating the rotary table while causing the optical sensor to emit light of a second light quantity different from the first light quantity.

* * * * *